United States Patent [19]
Abe et al.

[11] Patent Number: 5,550,775
[45] Date of Patent: Aug. 27, 1996

[54] SEMICONDUCTOR DEVICE FOR GENERATING HIGH VOLTAGE POTENTIALS

[75] Inventors: Wataru Abe; Akihiro Yamamoto; Takehiko Nakajima; Makoto Kojima, Osaka, all of Japan

[73] Assignee: Matsushita Electronics Corporation, Osaka, Japan

[21] Appl. No.: 361,551

[22] Filed: Dec. 22, 1994

[30] Foreign Application Priority Data

Dec. 28, 1993 [JP] Japan ................................ 5-337210

[51] Int. Cl.⁶ .............................. G11C 7/00; H03K 4/58
[52] U.S. Cl. ............... 365/189.11; 365/227; 365/230.06; 327/530; 327/589
[58] Field of Search ........................ 365/189.11, 230.06, 365/227; 327/503, 540, 589

[56] References Cited

U.S. PATENT DOCUMENTS

| | | | |
|---|---|---|---|
| 4,896,297 | 1/1990 | Miyatake et al. | 365/189.11 |
| 5,185,721 | 2/1993 | Love et al. | 365/189.11 X |
| 5,353,257 | 10/1994 | Yanagisawa et al. | 365/230.06 |
| 5,404,329 | 4/1995 | Yamagata et al. | 365/189.11 X |

FOREIGN PATENT DOCUMENTS

| | | |
|---|---|---|
| 2-247892 | 10/1990 | Japan . |
| 3-130989 | 6/1991 | Japan . |

*Primary Examiner*—David C. Nelms
*Assistant Examiner*—Son Dinh
*Attorney, Agent, or Firm*—McDermott Will & Emery

[57] ABSTRACT

A semiconductor device comprises: a signal of high voltage not less than the power voltage; a first transistor for transmitting the high voltage signal; a second transistor for electrically charging and discharging the gate potential of the first transistor; and a circuit for generating a pulse signal of which "H" level is a voltage higher than the power voltage by the threshold voltage of the second transistor. The pulse signal generating circuit is connected to the gate electrode of the second transistor. This cancels the drop of a voltage corresponding to the threshold voltage generated at the time when the electric charge is transferred to the gate electrode of the first transistor. Accordingly, even though the power voltage is low, a high voltage signal can be transferred through the first transistor and the word line potential can be boosted to a voltage not less than the power voltage.

29 Claims, 17 Drawing Sheets

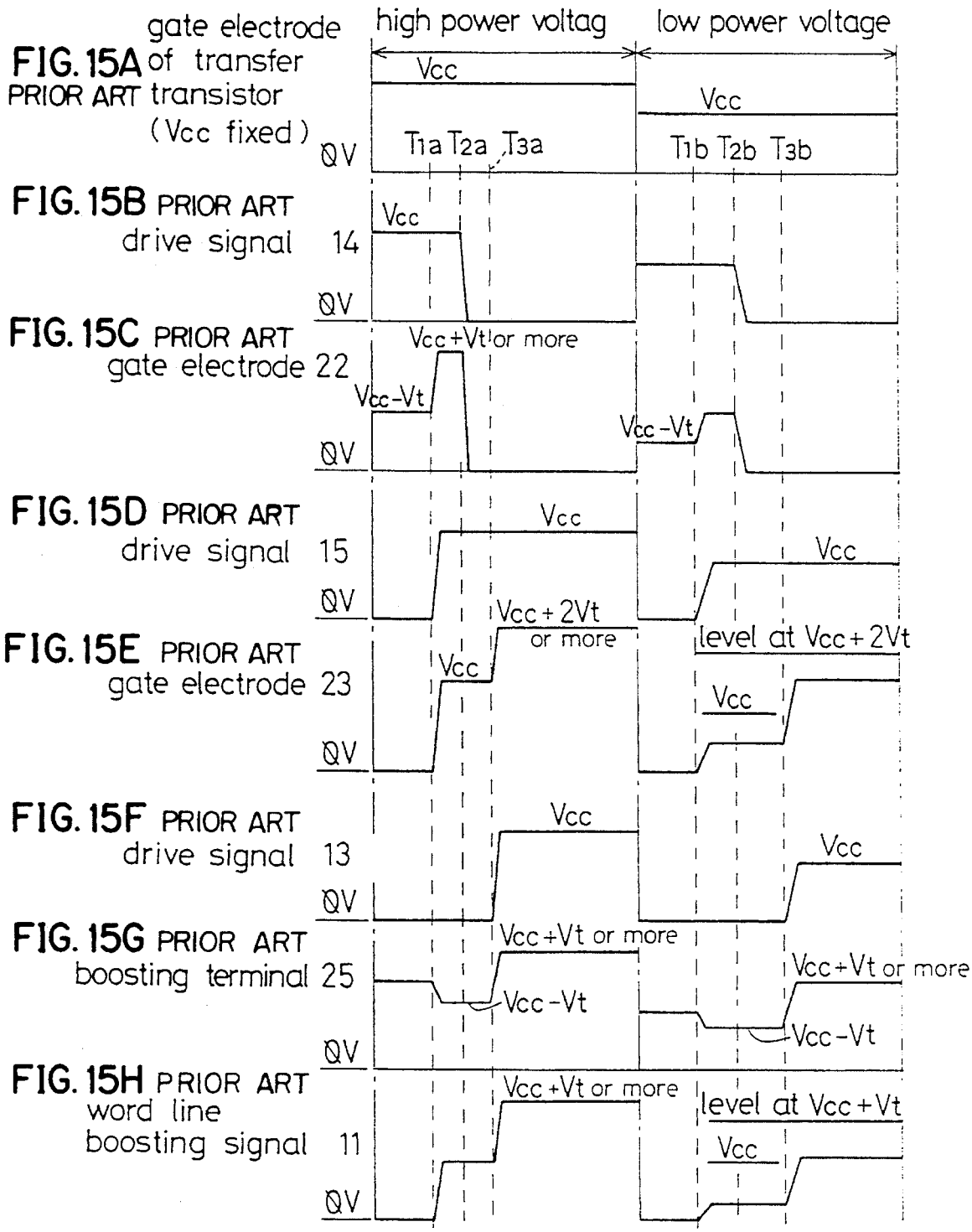

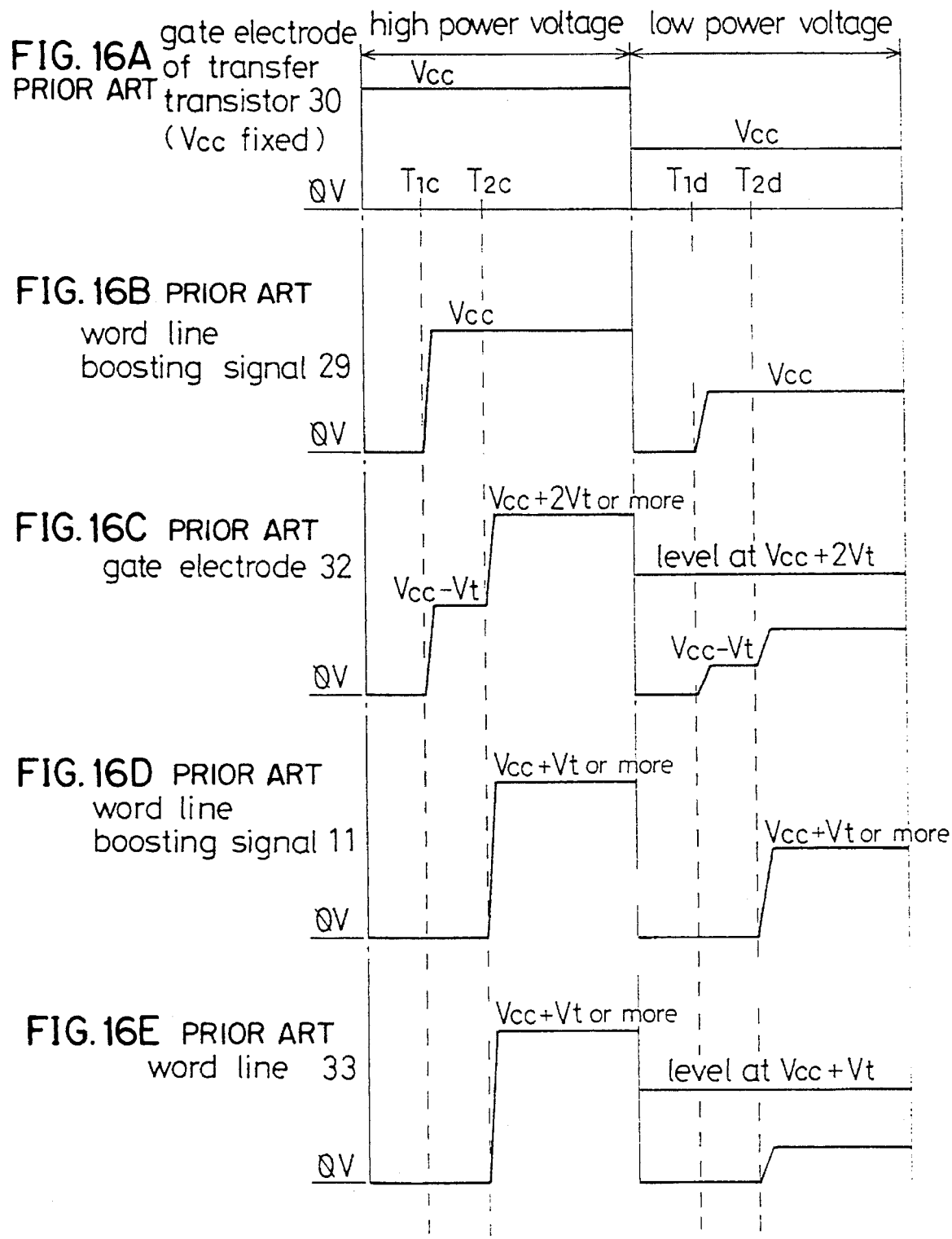

5,550,775

1

SEMICONDUCTOR DEVICE FOR GENERATING HIGH VOLTAGE POTENTIALS

BACKGROUND OF THE INVENTION

The present invention relates to a semiconductor device for generating a high potential, such as a word line potential, which is not less than the power voltage.

FIG. 13 is a schematic view of a semiconductor device of prior art.

Shown in FIG. 13 are a boosted potential generating circuit 1, a word line driver circuit 2, a row address buffer circuit 3, a row address decoding circuit 4, a sense amplifying circuit 5, and a memory cell array 6. In this semiconductor device of prior art, a signal of a high potential which has been supplied from the boosted potential generating circuit 1 and which is not less than the power voltage, is to be transferred to the word line driver circuit 2 to raise the potential of a word line selected by the row address decoding circuit 4, to the power voltage or more.

There is also disposed a level holding circuit 7. In an operational mode in which the potential of a word line is continuously raised for a long period of time (about several µ seconds), even though leak currents such as leak currents through transistors or the like, reduce the electric charge of a word line boosting signal 11 to be discussed later, the level holding circuit 7 compensates for such a reduction to prevent the word line potential from being reduced. Also shown in FIG. 13 are a drive signal control circuit 8, a starting signal 9, a row address signal 10 to be generated in the semiconductor device, the word line boosting signal 11, drive signals 12, 13, 14, 15, 16, n-channel MOS-type transfer transistors 17, 18, 19, 20, 21, 30, 31, gate electrodes 22, 23, 32 of the transfer transistors 19, 20, 31, a capacitor 24, a boosting terminal 25, a power source 26, a grounding 27, an excessive-boosting preventing circuit 28, a word line selecting signal 29, a word line 33, and a bit line 34. It is noted that the semiconductor device has a plurality of word lines and a plurality of bit lines, but only one word line and only one bit line are shown in FIG. 13.

A memory cell 35 is shown as one of a plurality of memory cells disposed in the memory cell array 6. There are also disposed an n-channel MOS-type selection transistor 36 and a capacitor 37. When the potential of the word line 33 is raised to the power voltage or more by the boosted potential generating circuit 1, the selection transistor 36 in the memory cell 35 is electrically conducted. This cancels a voltage drop corresponding to the threshold voltage in the selection transistor 36. Accordingly, the electric charge can efficiently be redistributed between the capacitor 37 and the bit line 34.

FIG. 14 is a schematic view of an example of the drive signal control circuit.

Shown in FIG. 14 are the starting signal 9, the drive signals 12, 13, 14, 15, 16, a delay device 81, a NAND 82, and inverters 83a, 83b, 83c, 83d, 83e, 83f, 83g, 83h, 83i. The delay times of these logic circuits 82, 83a to 83i form the timings for the drive signals 12, 13, 14, 15, 16. A booster 84 controls the potential of the drive signal 12 such that "H" is equivalent to Vcc+Vt and "L" is equivalent to Vcc.

When the starting signal 9 is activated at time T81, the following signals are activated in the following manner based on the respective delay times of the logic circuits 82, 83a to 83i and the delay device 81. That is, the drive signal 16 is activated to the "L" level at time T82, the drive signal 12 is activated to the "L" level at time T83, the drive signal 15 is activated to the "H" level at time T84, the drive signal 14 is activated to the "L" level at time T85, and the drive signal 13 is activated to the "H" level at time T86, and the operation of the boosted potential generating circuit 1 is controlled.

To prevent a plurality of word lines from being simultaneously selected in the word line driver circuit 2, the word line boosting signal 11 is required to be activated with a sufficient time allowance after the row address signal 10 internally generated by the starting signal 9 has been determined. In this connection, the delay device 81 is disposed for adjusting the timing at which the word line boosting signal 11 is activated.

With reference to FIGS. 15, 16, the following description will discuss the operation of the semiconductor device having the arrangement above-mentioned.

FIG. 15 shows the operational waveforms of main signals in the boosted potential generating circuit 1.

At the waiting state, the drive signal 13, the drive signal 15 and the gate electrode 23 are in the "L" level (0 V), the drive signal 14, the drive signal 16 and the boosting terminal 25 are in the "H" level (Vcc), the drive signal 12 is in the "H" level (Vcc+Vt), and the capacitor 24 is initially charged (difference in potential across the terminals=Vcc). The voltage off the gate electrode of the transfer transistor 18 is fixed to the power voltage. Accordingly, the potential of the gate electrode 22 is equal to "Vcc—threshold voltage" (hereinafter referred to as Vt), and the transfer transistor 19 becomes electrically conducted. At this time, the difference in potential between the gate and drain of the transfer transistor 18 (hereinafter referred to as Vgd) is 0 V. Accordingly, the gate electrode 22 is electrically disconnected from the drive signal 14.

When the starting signal 9 is activated, the drive signal 16 becomes the "L" level and the transfer transistor 21 which fixes the potential of the word line boosting signal 11 to the grounding potential, becomes electrically non-conducted.

Subsequently, when the drive signal 12 becomes the "L" level (=Vcc), the Vgd of the transfer transistor 17 which initially charges the capacitor 24 and which fixes the potential of the boosting terminal 25 to the power voltage, becomes 0 V such that the boosting terminal 25 is electrically disconnected from the power source 26.

When the drive signal 15 is raised to the "H" level (Vcc) at time T1a in the case where the power voltage is high, the transfer of electric charge to the gate electrode 23 through the transfer transistor 19 starts. At this time, the gate-source capacitance of the transfer transistor 19 (hereinafter referred to as Cgs) causes the potential of the electrically disconnected gate electrode 22 to be raised to a potential of Vcc+Vt or more with a rise in potential of the gate electrode 23 (hereinafter referred to as bootstrap effect). This results in cancellation of a voltage drop corresponding to Vt in the transfer transistor 19, causing the potential of the gate electrode 23 to be raised to Vcc. At this time, since the transfer transistor 20 becomes electrically conducted, the potential of the word line boosting signal 11 starts rising. At this time, the potential of the boosting terminal 25 is also lowered. With the potential drop of the boosting terminal 25, the difference in potential between the gate and source (hereinafter referred to as Vgs) in the transfer transistor 17 gradually increases. When the Vgs becomes not less than Vt, the transfer transistor 17 becomes electrically conducted. Accordingly, the potential of the boosting terminal 25 does not become Vcc−Vt or less.

When the potential of the drive signal 14 is brought to the "L" level (not greater than Vcc–Vt; 0 V in FIG. 15) at time T2a, the gate electrode 22 and the drive signal 14 are again electrically connected to each other through the transfer transistor 18. Thus, the potential of the gate electrode 22 becomes the "L" level (not greater than Vcc–Vt; 0 V in FIG. 15). At this time, the transfer transistor 19 becomes electrically non-conducted and the gate electrode 23 becomes electrically disconnected, as maintained at the Vcc level, from the drive signal 15.

When the drive signal 13 is raised to the "H" level (power voltage Vcc) at time T3a, the electric charge accumulated in the capacitor 24 is pushed out to the boosting terminal 25. Thus, the transfer of the electric charge to the word line boosting signal 11 through the transfer transistor 20 starts. At this time, the electric charge is redistributed between the capacitor 24 and the parasitic capacitance components such as the capacitances of the gates connected to the boosting terminal 25, such that the potential of the boosting terminal 25 is raised to a high potential of not less than Vcc+Vt. Further, the bootstrap effect in the transfer transistor 20 increases the potential of the gate electrode 23 to Vcc+2 Vt or more. This cancels a voltage drop corresponding to Vt in the transfer transistor 20 such that the word line boosting signal 11 can be driven to a high voltage identical with that of the boosting terminal 25.

FIG. 16 shows the operational waveforms of main signals in the word line driver circuit 2. In the word line driver circuit 2, the potentials of the word line selecting signal 29, the gate electrode 32 and the word line 33 are the "L" level (0 V). The potential of the gate electrode of the transfer transistor 30 is fixed to the power voltage Vcc level. Accordingly, when the word line selecting signal 29 is raised to the "H" level at time T1c, the gate electrode 32 is electrically charged up to the level Vcc–Vt and the transfer transistor 31 becomes electrically conducted. At this time, the Vgd of the transfer transistor 30 is equal to 0 V and the gate electrode 32 is electrically disconnected from the word line selecting signal 29. When there starts the transfer of the word line boosting signal 11 raised to not less than Vcc+Vt toward the word line 33 through the transfer transistor 31 at time T2c, the boot-strap effect in the transfer transistor 31 increases the voltage of the gate electrode 32 to not less than Vcc+2 Vt. This cancels a voltage drop corresponding to Vt in the transfer transistor 31 so that the word line 33 can be driven to a high potential identical with that of the word line boosting signal 11.

The following description will discuss the arrangement of the conventional level holding circuit 7 in FIG. 13. FIG. 17 is a schematic view of the conventional level holding circuit 7. Shown in FIG. 17 are a ring oscillator 901 having odd-number stages, an oscillation signal 902 supplied from the ring oscillator 901, N-type MOS transistors 903, 904, 905, a NAND circuit 906, a drive inverter 907, a capacitor 908 and an output terminal 909 connected to the word line boosting signal 11.

The following description will discuss the operation of the level holding circuit 7. Since the word line boosting signal 11 is in the "H" level (not less than Vcc+Vt), the ring oscillator 901 supplies the oscillation signal 902 in which "H" is equal to the power voltage Vcc and "L" is equal to 0 V. Further, since the word line boosting signal 11 is also connected to the gate electrode of the transistor 903, the transistor 903 is electrically conducted. Since the potential of the word line boosting signal 11 is not less than Vcc+Vt, the following equations are established in the transistor 903;

$Vds=Vgs-Vt \geq (Vcc+Vt)-Vt =$ Power Voltage Vcc wherein Vds refers to the difference in potential between the drain and the source.

Thus, the transistor 903 can transfer the electric charge without loss of voltage corresponding to Vt.

When the potential of the oscillation signal 902 is in the "H" level (=power voltage Vcc), that is, when the output of the drive inverter 907 is in the "L" level, the Vgs of the transistor 904 becomes not less than Vt, causing the transistor 904 to be electrically conducted. At this time, the gate electrode of the transistor 904 is connected to the power voltage Vcc. Accordingly, each of the gate electrodes of the capacitor 908 and the transistor 905 is electrically charged up to Vcc–Vt because the following equation is established in the transistor 904;

$Vds=Vgs-Vt$

At this time, the following equations are established in the transistor 905;

$Vgs =$ (the gate potential of the transistor 905)–(the potential of the word line boosting signal 11)$=(Vcc-Vt) -(Vcc+Vt$ or more$) \leq Vt$ Accordingly, the transistor 905 is in the cutoff state.

On the other hand, when the potential of the oscillation signal 902 is in the "L" level (=0 V), that is, when the output of the drive inverter 907 is in the "H" level, the potential combined effect of the capacitor 908 raises the potential of the gate electrode of the transistor 905 to (Vcc–Vt)+Vcc=2 Vcc–Vt. At this time, when the Vgs of the transistor 905 is not less than Vt, the transistor 905 becomes electrically conducted and the electric charge accumulated in the capacitor 908 is supplied to the word line boosting signal 11 through the transistor 905. At this time, there is generated a loss of voltage corresponding to Vt in the transistor 905. Accordingly, the potential of the output terminal 909 becomes (2 Vcc–Vt)–Vt=2(Vcc–Vt). Further, the following equations are established in the transistor 904;

$Vgs=Vcc-(2Vcc-Vt) \leq Vt$

Accordingly, the transistor 904 becomes in the cutoff state and the electric charge is not reversely transferred to the power source (Vcc).

Thereafter, when the potential of the oscillation signal 902 is brought again to the "H" level, the transistor 905 is cutoff to stop the supply of the electric charge and the transistor 904 becomes electrically conducted. Accordingly, the gate electrode of the transistor 905 and the capacitor 908 are electrically charged through the transistor 903. By repeating the cycle above-mentioned, the potential of the word line boosting signal 11 is maintained.

With reference to FIG. 17, the following description will discuss the inside arrangement of the excessive-boosting preventing circuit 28 in FIG. 13. In FIG. 17, the N-type MOS transistors are diode-connected to the word line boosting signal 11. Accordingly, the potential of the word line boosting signal 11 is clamped at a potential which is higher by n×Vt (wherein n refers to the number of stages of the N-type MOS transistors) than the power voltage Vcc. To lengthen the memory holding period of time in a memory device, it is more advantageous that Vt of each transistor of each memory cell is higher. Accordingly, the memory device uses transistors each having Vt which is higher than Vt of each transistor used in a peripheral circuit. Accordingly, the conventional excessive-boosting preventing circuit 28 is arranged such that the potential of the word line boosting signal 11 is clamped using transistors used in the peripheral circuit.

Nowadays, with the demand For a lower voltage power source, there is strongly desired a circuit to be operated with low power consumption.

In the conventional semiconductor device, however, when provision is made to provide a lower voltage power source without the threshold voltage Vt lowered, this increases the rate of the threshold voltage of each transistor with respect to the power voltage Vcc. Accordingly, the initial potential= Vcc−Vt of the gate electrode 22 becomes very small (for example, when it is supposed that Vt is equal to 0.7 V at the time the power voltage Vcc is equal to 1.5 V, the value of Vcc−Vt becomes 0.8 V). As a result, the following problems arise.

With reference to FIG. 15, the following description will discuss the operation of the boosted potential generating circuit 1 when the power voltage is low.

At the waiting state, each of the drive signal 13, the drive signal 15 and the gate electrode 23 is in the "L" level (0 V), and each of the drive signal 12, the drive signal 14, the drive signal 16 and the boosting terminal 25 is in the "H" level (power voltage Vcc). Since the voltage of the gate electrode of the transfer transistor 18 is fixed to the power voltage, the potential of the gate electrode 22 becomes Vcc−Vt.

When provision is made to provide a low voltage power source without the threshold voltage Vt lowered, the potential of the gate electrode 22 becomes very small. This lowers the transfer transistor 19 in current drive ability. In the extreme case, the transfer transistor 19 is caused to be electrically non-conducted.

Accordingly, even though the drive signal 15 is raised to the "H" level (power voltage Vcc) at time T1b, the potential of the gate electrode 23 cannot be raised to the power voltage Vcc. As a result, simultaneously when the drive signal 14 is brought to the "L" level at time T2b, the potential of the gate electrode 22 is brought to the "L" level through the transfer transistor 18 to cause the transfer transistor 19 to be electrically non-conducted. Thereafter, when the drive signal 13 is raised to the "H" level (power voltage Vcc) at time T3b, the potential of the boosting terminal 25 is raised to a high potential of Vcc+Vt or more and the electric charge is transferred to the word line boosting signal 11 through the transfer transistor 20. However, since the potential (Vcc−Vt) of the gate electrode 23 of the transfer transistor 20 is very small, the rise in potential of the gate electrode 28 due to the bootstrap effect in the transfer transistor 20 is insufficient. Accordingly, there are instances where Vgs in the transfer transistor 20 is not greater than Vt with the rise in the source potential (word line boosting signal 11) of the transfer transistor 20. This causes the transfer transistor 20 to be electrically non-conducted, thus preventing the word line boosting signal 11 from being driven to a potential identical with that of the boosting terminal 25.

With reference to FIG. 16, the following description will discuss the operation of the word line driver circuit 2 when the power voltage is low.

At the waiting state, each of the potentials of the word line selecting signal 29, the gate electrode 32 and the word line 33 is in the "L" level (0 V). The potential of the gate electrode of the transfer transistor 80 is fixed to the power voltage Vcc level. Accordingly, when the word line selecting signal 29 is raised to the "H" level at time T1d (T1c), the gate electrode 82 is electrically charged up to the level Vcc−Vt. Likewise in the boosted potential generating circuit 1, when provision is made to provide a low voltage power source without the threshold voltage Vt lowered, the potential of the gate electrode 82 becomes very small. This lowers the transfer transistor 81 in current drive ability. In the extreme case, the transfer transistor 81 is caused to be electrically non-conducted. As a result, even though the word line boosting signal 11 raised to Vcc+Vt or more is transferred at time T2d, this signal cannot disadvantageously be transferred to the word line 33.

Thus, the problems encountered in the boosted potential generating circuit 1 and the word line driver circuit 2 have been discussed. Such problems are present in any signal transmitting device having the common arrangement of the circuits 1 and 2, in which when the starting signal 9 (first signal) is generated, a second signal (for example, a signal at the boosting terminal 25 in the boosted potential generating circuit 1 or a word line boosting signal in the word line driver circuit 2) is transmitted to the outside as a third signal (for example, as a word line boosting signal in the former circuit 1 or as a signal for boosting the word line 33 in the latter circuit 2) because of electrical conduction of a first transistor (for example, the transistor 19 in the former circuit 1 or the transistor 31 in the latter circuit 2).

In the conventional level holding circuit 7, when provision is made to provide a low power voltage Vcc without Vt lowered, the following problems arise.

For example, when the power voltage Vcc is equal to 5 V and Vt is equal to 1 V, the following equations are established in the transistor 905;

$$Vg=2Vcc-Vt=2\times 5V-1V=9V$$

wherein Vg refers to the gate potential.

When the power voltage Vcc is equal to 5 V, the word line boosting signal 11 is raised to about 7.5 V. However, when it is supposed that the word line boosting signal 11 has been reduced in potential to about 6 V due to leak currents or the like, the following equations are established;

$$Vgs=9V-6V\geq Vt$$

Accordingly, the electric charge is supplied through the transistor 905 such that the potential of the word line boosting signal 11 can be restored to $2(Vcc-Vt)=2\times(5-1)=8$ V. When the power voltage Vcc is equal to 3 V and Vt is equal to 1 V, Vg in the transistor 905 becomes equal to 5 V. Here, it is supposed that the potential of the word line boosting signal 11 is normally about 4 or 5 V but has been reduced to about 3 V due to leak currents or the like. Through the transistor 905, the potential of the word line boosting signal 11 is restored to $2(Vcc-Vt)=2\times(3-1)=4$ V, which is still lower than the initial potential. More specifically, when provision is made in the conventional level holding circuit 7 to provide a lower power voltage Vcc without Vt lowered, the charge feed ability is disadvantageously insufficient.

Further, when the threshold voltages Vt of transistors in memory cells and peripheral circuits vary with process variations in the conventional excessive-boosting preventing circuit 28, there are instances where the degree of operational allowance is remarkably reduced because the varying manners are different from one another. For example, it is supposed that when the power voltage Vcc is equal to 3.6 V, the threshold voltage of the selection transistor 86 (hereinafter referred to as Vt(MC)) when reading "1" from the memory cell 35, is equal to 1.4 V. In this case, the potential required for the word line 33 is not less than Vcc+Vt(MC)= 5.0 V. On the other hand, the potential of the word line boosting signal 11 is determined by a clamping potential of the excessive-boosting preventing circuit 28. Since the clamping potential is equal to Vcc+2 Vt which is equal to 3.6

V+2×0.8 V which is equal to 5.2 V, it can be said that the potential of the word line 33 is sufficient. Here, it is supposed that Vt(MC) becomes equal to 1.5 V (a rise by 0.1 V as compared with the standard) and Vt becomes equal to 0.1 V (a decrease by 0.1 V as compared with the standard) due to variations of process conditions. In this case, the potential required for the word line 33 is not less than 5.1 V. On the other hand, the potential of the word line boosting signal 11 is actually equal to 5.0 V. Thus, the word line 33 is insufficient in potential.

APPLICATION OF THE DISCLOSURE

It is an object of the present invention to provide a semiconductor device in which, even though the power voltage is low, the electric charge is transferred to the output terminal without any loss in voltage, thereby to generate a high voltage not less than the power voltage.

To achieve the object above-mentioned, the semiconductor device of the present invention is arranged such that a voltage not less than Vcc+Vt is applied to the gate electrode of a transistor for a necessary period of time to cancel the loss of a voltage corresponding to the threshold voltage Vt in the transistor.

More specifically, the present invention is directed to a semiconductor device comprising a signal transmitting device in which, upon generation of a first signal, a second signal is transmitted and then supplied as a third signal, and the present invention is premised on the arrangement that the signal transmitting device comprises: a first transistor arranged such that, upon generation of the first signal, the second signal is transmitted and then supplied as the third signal; and a second transistor for electrically charging and discharging the gate electrode of the first transistor. The semiconductor device further comprises a boosted pulse generator for generating a boosted pulse which is brought to a high level not less than the power voltage at the timing at which the first signal is activated or inactivated, and which is brought to a low level before the second signal is activated, a boosted pulse from the boosted pulse generator being entered into the gate electrode of the second transistor of the signal transmitting device.

To achieve the object above-mentioned, the present invention also provides, as another means, a semiconductor device which has, as the basic arrangement, the arrangement according to claim 1 and in which each of the first and second transistors of the signal transmitting device is formed by a transistor of which threshold voltage is lower than that of each of other transistors forming the signal transmitting device.

The present invention also provides, as further means, a semiconductor device having the arrangement according to any of claims 1 and 21, which further comprises: level holding means for holding the potential level of the third signal of the signal transmitting device, the level holding means comprising, between the power source and the wiring for the third signal, a two-hierarchical charge pump and switch means to be electrically conducted when the third signal is supplied.

According to the present invention, the semiconductor device may further comprise excessive-boosting preventing means for preventing a word line boosting signal generated by the word line boosting signal generator from being excessively boosted, the excessive-boosting preventing means being formed by an excessive-boosting preventing transistor interposed between the power source and the passage for the word line boosting signal, the word line boosting signal being entered into the gate electrode of the excessive-boosting preventing transistor, the threshold voltage of the excessive-boosting preventing transistor being not less than that of each of the selection transistors connected to the memory cells. With the arrangement above-mentioned, the semiconductor device according to the present invention is arranged such that a boosted pulse of a high level not less than the power voltage is applied to the gate electrode of the second transistor, such that the potential of the gate electrode of the first transistor can be boosted to a potential higher than the power voltage by the threshold voltage Vt. This cancels the loss of a voltage corresponding to the threshold voltage Vt of the first transistor. Accordingly, the second signal can be transmitted without the potential thereof lowered, and the third signal having a potential identical with that of the second signal, can be obtained. Thus, even though the power voltage is low, a sufficient signal transmitting ability can be assured.

According to the another semiconductor device of the present invention, the threshold voltage Vt of the first transistor is sufficiently low. Therefore, the voltage loss in the first transistor is minimized, enabling the second signal to be transmitted without the potential thereof lowered so much. Accordingly, there can be obtained the third signal having a potential substantially identical with that of the second signal. Thus, even though the power voltage is low, a sufficient signal transmitting ability can be assured.

According to the further semiconductor device of the present invention, the two-hierarchical charge pump sufficiently assures the ability of supplying the electric charge. Thus, the third signal is not lowered in potential, but can securely be held to its proper potential.

In a semiconductor device as obtained by technically limiting each of the semiconductor devices of the present invention, the excessive-boosting preventing transistor has an arrangement identical with that of each of the selection transistors of the memory cells. Accordingly, even though the threshold voltage of a selection transistor varies at the time of processing or operation, the threshold voltage of the excessive-boosting preventing transistor correspondingly varies in a similar manner. Thus, the clamping level of the third signal can always suitably be set, thus providing a sufficient degree of operational allowance.

These and other features, objects and advantages of the present invention will be more fully apparent from the following detailed description set forth below when taken in conjunction with the accompanying drawings.

DESCRIPTION OF THE DRAWINGS

FIG. 15 is a view illustrating the relationship between the power voltage and the main signal operations in the boosted potential generating circuit in the semiconductor device of prior art in FIG. 13;

FIG. 16 is a view illustrating the relationship between the power voltage and the main signal operations in the word line driver circuit in the semiconductor device of prior art in FIG. 13.

DESCRIPTION OF THE INVENTION

The following description will discuss preferred embodiments of the present invention with reference to attached drawings.

(First Embodiment)

Figure 1:
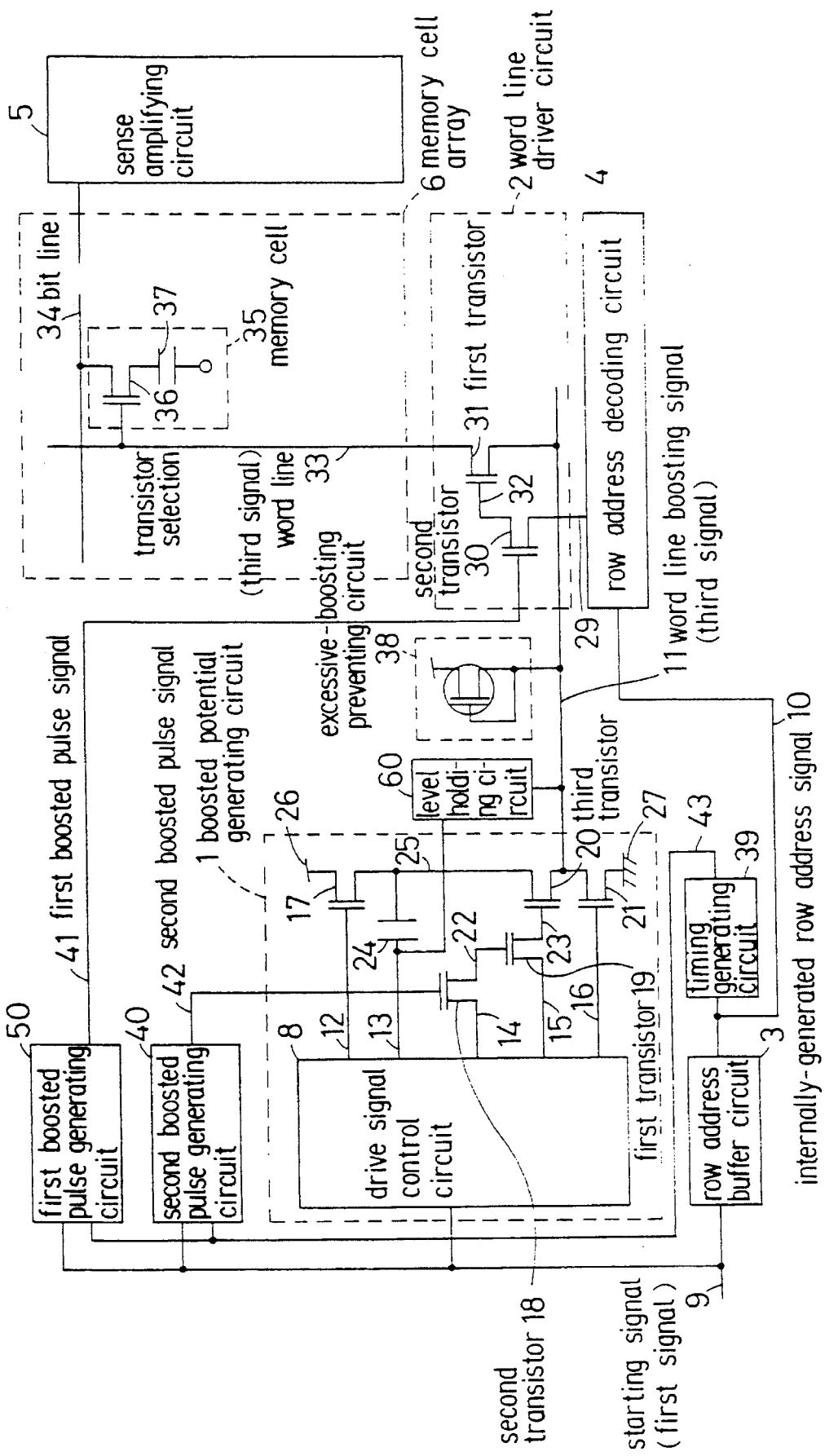
FIG. 1 is a schematic view of a semiconductor device according to a first embodiment of the present invention.

FIG. 1 is a schematic view of a semiconductor device according to a first embodiment of the present invention. Shown in FIG. 1 are a boosted potential generating circuit (a signal transmitting device) 1, a word line driver circuit (other signal transmitting device) 2, a row address buffer circuit 3, a row address decoding circuit 4, a sense amplifying circuit 5, a memory cell array 6, a drive signal control circuit 8, a starting signal 9, an internally generated row address signal 10, a word line boosting signal 11 which is supplied, as a third signal, from the boosted potential generating circuit 1, and drive signals 12, 13, 14, 15, 16.

Disposed in the boosted potential generating circuit 1 are a first n-channel MOS transfer transistor 19, a second n-channel MOS transfer transistor 18 for charging and discharging the gate electrode of the first transfer transistor 19, and a third n-channel MOS transfer transistor 20 having a gate electrode to be charged and discharged by the first transfer transistor 19. There are also disposed the gate electrodes 22, 23 of the first and third transfer transistors 19, 20, a capacitor 24, a boosting terminal 25 and n-channel MOS transistors 17, 21.

Disposed in the word line driver circuit 2 are a first n-channel MOS transfer transistor 31, a second n-channel MOS transfer transistor 30 for charging and discharging the first transfer transistor 31, and the gate electrode 32 of the first transfer transistor 31.

There is also disposed a power source 26 for supplying an internal power voltage (=Vcc) which is generated by dropping the external power voltage. In the following description, the power source refers to this internal power source low in voltage.

There are also disposed a grounding 27, a word line selecting signal 29, a word line 33, and a bit line 34. It is noted that the semiconductor device has a plurality of word lines and a plurality of bit lines, but only one word line and only one bit line are shown in FIG. 1.

A memory cell 35 is shown as one of a plurality of memory cells disposed in the memory cell array 6. There are also disposed an n-channel MOS selection transistor 36 which is disposed in the memory cell 35 and of which threshold voltage Vt is higher than that of each of other transistors. A capacitor 37 is also disposed. The arrangement above-mentioned is the same as in the semiconductor device of prior art.

An excessive-boosting preventing circuit 38 is formed by an n-channel MOS transistor having a threshold voltage not less than the threshold voltage Vt of the selection transistor 36 in the memory cell 35 (In FIG. 1, this transistor bears a circle mark indicating that this transistor is different in Vt from other transistors).

A timing generating circuit 39 is disposed for shifting, with respect to the timing at which the internally generated row address signal is activated, the timings at which boosted pulse signals 41, 42 are inactivated. Shown in FIG. 1 are boosted pulse generating circuits 40, 50, the boosted pulse signals 41, 42, a boosted pulse inactivating signal 43, and a level holding circuit 60. In the level holding circuit 60, a two-hierarchical charge pump is disposed such that, even though an electric charge leaks from the word line boosting signal 11 when the word line potential has been boosted for a long period of time, such leak charge can sufficiently be compensated for even though the power voltage is low.

Figure 4:
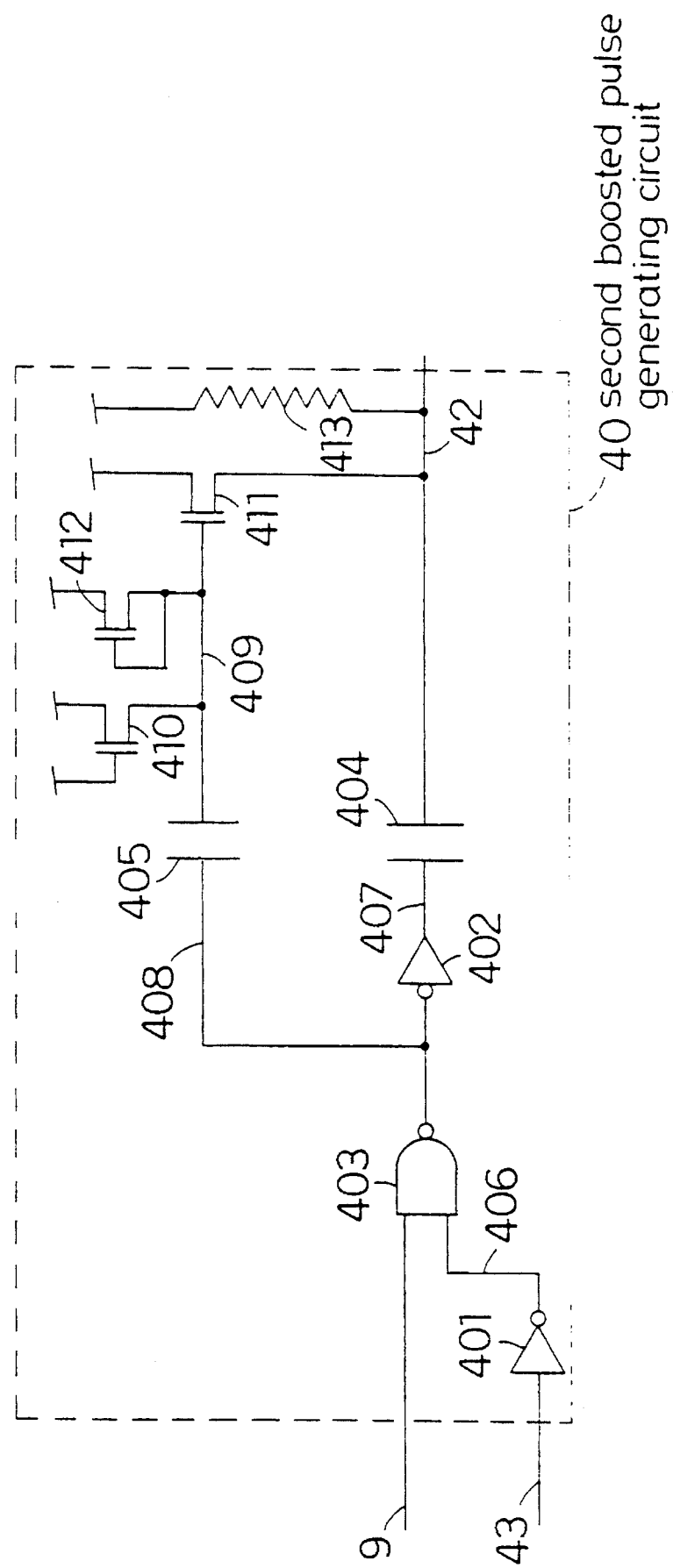
FIG. 4 is a schematic view of the second boosted pulse generating circuit in the semiconductor device in FIG. 1.

FIG. 4 is a schematic view of the boosted pulse generating circuit 40 in the first embodiment. Shown in FIG. 4 are the starting signal 9, the boosted pulse inactivating signal 43, the boosted pulse signal 42, inverters 401, 402, a NAND circuit 403, and capacitors 404, 405. The capacitance value of the capacitor 404 is greater than that of the capacitor 405. Also shown in FIG. 4 are drive signals 406, 407, 408, a boosting terminal 409, n-channel MOS transistors 410, 411, 412, and a resistor element 413 formed by an n-type well of which resistance value is relatively great (several k$\Omega$ to several M$\Omega$ and of which current feed ability is therefore low.

Figure 5:
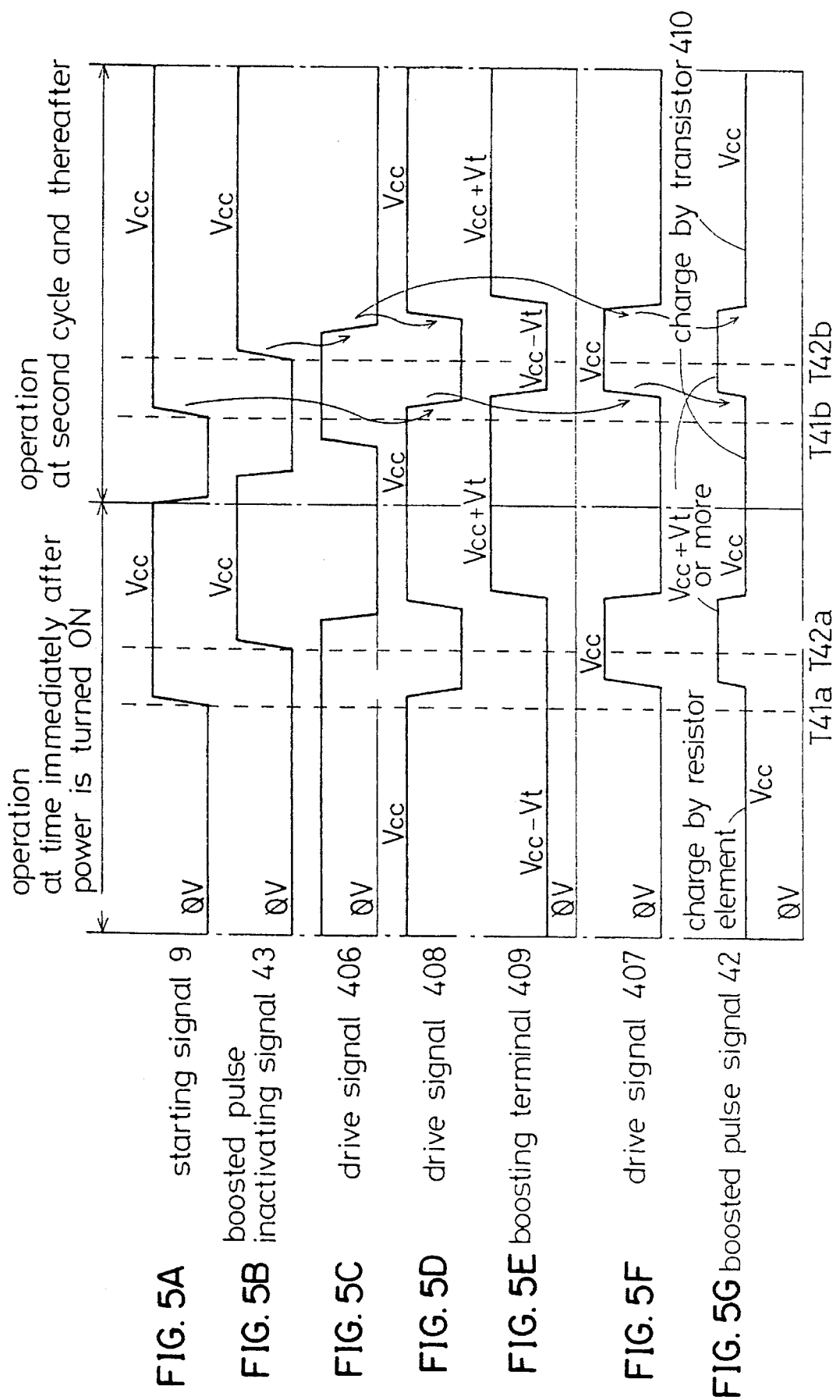
FIG. 5 is a view illustrating the operation of the boosted pulse generating circuit in FIG. 4.

FIG. 5 shows the operational waveforms of main signals in the boosted pulse generating circuit 40 having the arrangement above-mentioned. With reference to FIG. 5, the following description will discuss the operation of the circuit 40. At the time immediately after the power has been turned on, the boosted pulse signal 42 is connected to the power through the resistor element 413. Thus, the potential of the boosted pulse signal 42 is in the power voltage Vcc level. Further, the drive signal 407 is in the "L" level. Accordingly, the capacitor 404 is in the electrically charged state (difference in potential across the terminals=power voltage Vcc).

When the starting signal 9 is activated at time T41a, the drive signal 407 is brought to the "H" level and the boosted pulse signal 42 is boosted to a high potential not less than Vcc+Vt (the level of the boosted pulse signal 42 is maintained at potential as high as about several ns because of the low current feed ability of the resistor element 413). At this time, the potential of the boosting terminal 409 is brought to Vcc−Vt by the transistor 410 always in the electrically conducted state, and the drive signal 408 is in the "L" level.

Accordingly, the capacitor 405 is in the electrically charged state (difference in potential across the terminals=Vcc−Vt).

When the boosted pulse inactivating signal 43 is inactivated at time T42a, the drive signal 407 is brought to the "L" level. Accordingly, the combined effect of the capacitor 404 lowers the potential of the boosted pulse signal 42 to the "L" level. At the same time, the drive signal 408 is brought to the "H" level (power voltage Vcc) and the combined effect of the capacitor 405 boosts the potential of the boosting terminal 409 to Vcc+Vt. Accordingly, the initial charging of the boosted pulse signal 42 in the operations on and after the second cycle, is to be conducted by the transfer transistor 411. To prevent a plurality of word lines from being simultaneously selected in the word line driver circuit 2, the word line boosting signal 11 is activated with a predetermined delay time with respect to the timing at which the internally generated row address signal 10 is determined. In this connection, the timing at which the boosted pulse signal 42 is inactivated, is adjusted by the timing generating circuit 39 which is synchronized with the internally generated row address signal 10.

Figure 6:
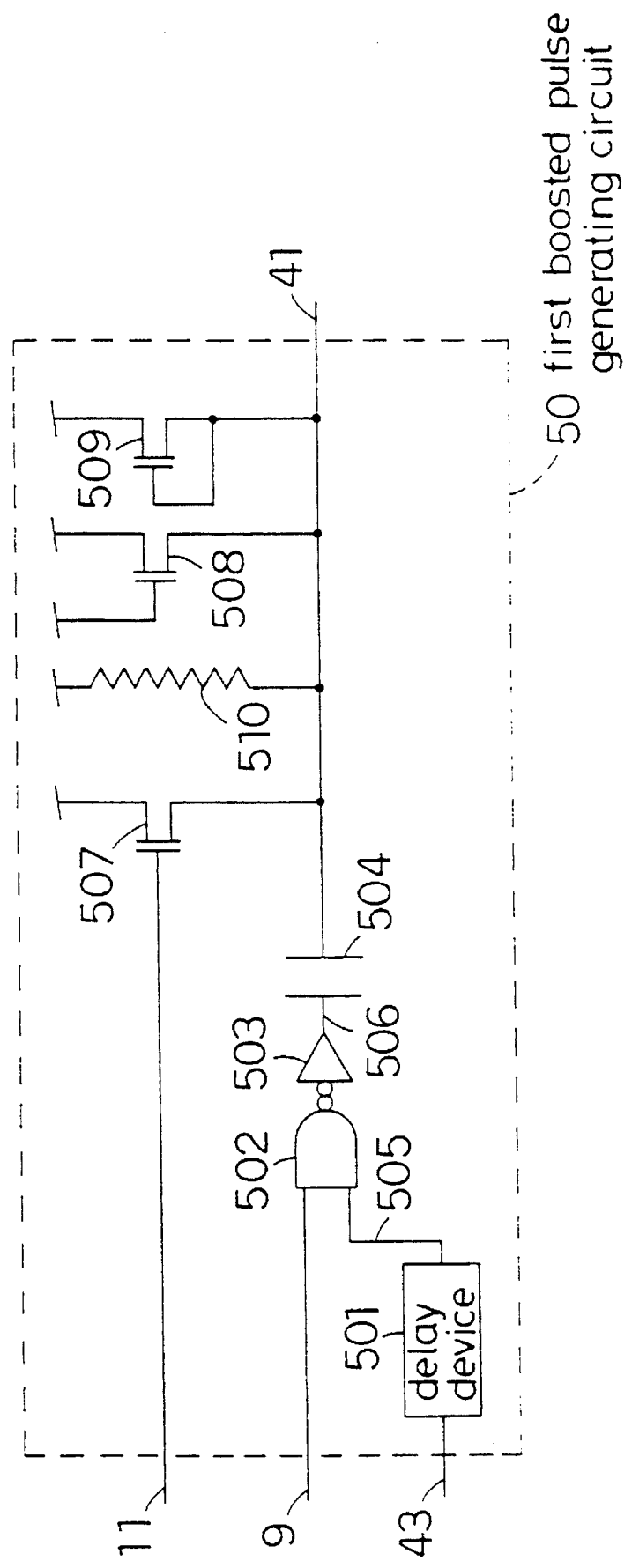
FIG. 6 is a schematic view of the first boosted pulse generating circuit in the semiconductor device in FIG. 1.

FIG. 6 is a schematic view off the boosted pulse generating circuit 50 in the first embodiment. Shown in FIG. 6 are the starting signal 9, the boosted pulse inactivating signal 43, the boosted pulse signal 41, the word line boosting signal 11, a delay device 501, a NAND circuit 502, an inverter 503, a capacitor 504, drive signals 505, 506, n-channel MOS transistors 507, 508, 509, a resistor element 510 formed by an n-type well of which resistance value is relatively great (several kΩ to several MΩ) and of which current feed ability is therefore low.

Figure 7:
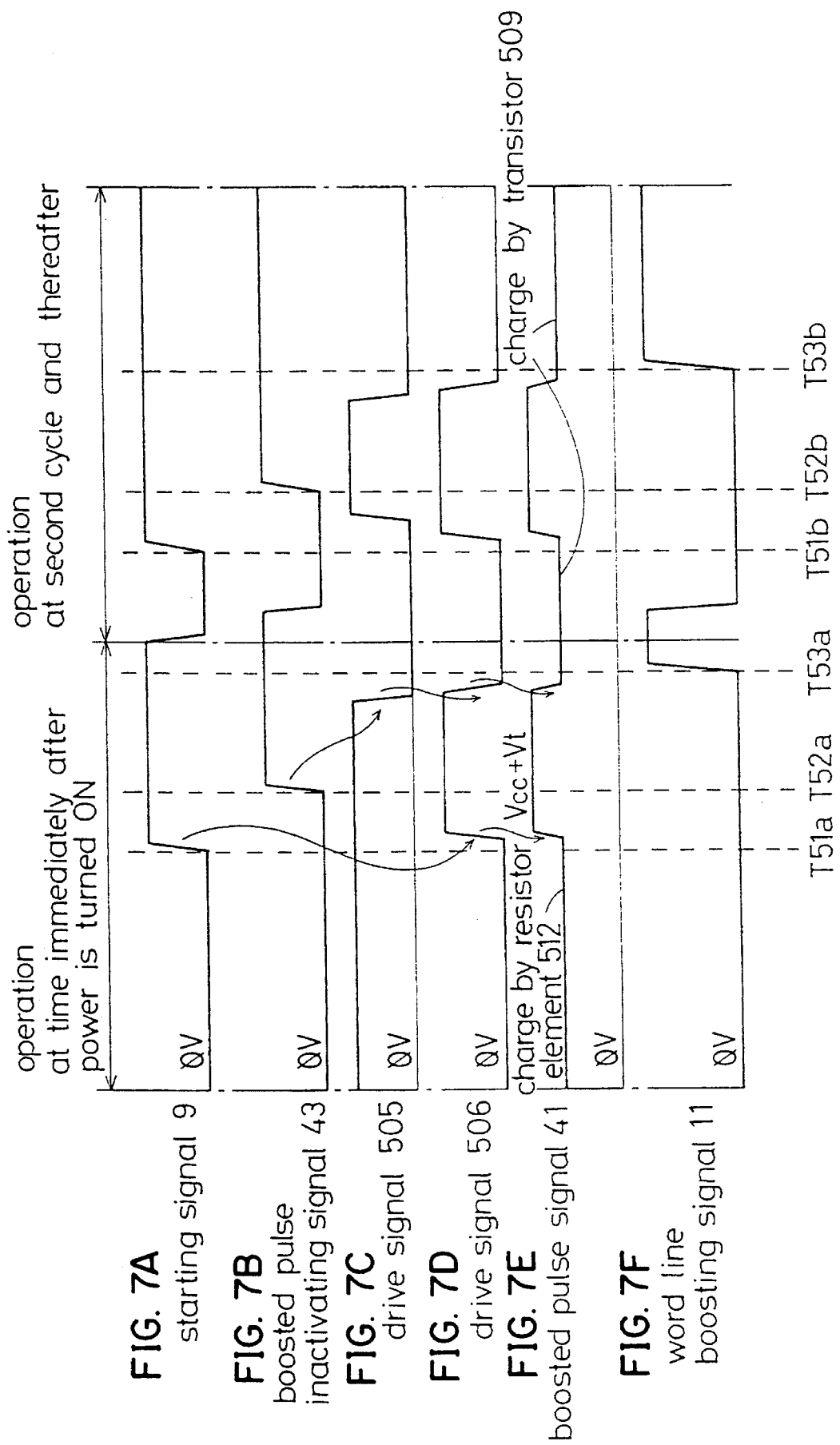
FIG. 7 is a view illustrating the operation of the boosted pulse generating circuit in FIG. 6.

FIG. 7 shows the operational waveforms of main signals of the boosted pulse generating circuit 50 having the arrangement above-mentioned. With reference to FIG. 7, the following description will discuss the operation of the circuit 50.

In the operation made immediately after the power has been turned on, the boosted pulse signal 41 is connected to the power source through the resistor element 510. Thus, the potential of the boosted pulse signal 41 is in the power voltage Vcc level. Further, the drive signal 506 is in the "L" level. Accordingly, the capacitor 504 is in the electrically charged state (difference in potential across the terminals= power voltage Vcc).

When the starting signal 9 is activated at time T51a, the drive signal 506 is brought to the "H" level and the boosted pulse signal 41 is boosted to a high potential not less than Vcc+Vt (the level of the boosted pulse signal 41 is maintained at a potential as high as about several ns because of small current feed ability of the resistor element 510).

When the boosted pulse inactivating signal 43 is activated at time T52a, the drive signal 506 is brought to the "L" level after the passage of delay time of the delay device 501. Accordingly, the combined effect of the capacitor 504 lowers the potential of the boosted pulse signal 41 to the "L" level.

When the word line boosting signal 11 is boosted to the power voltage or more at time 53a, this cancels the drop of a voltage corresponding to Vt in the transistor 507. Accordingly, the boosted pulse signal 41 in the operations on and after the second cycle, is initially electrically charged up to the power voltage Vcc level.

Likewise in the boosted pulse signal 42, the timing at which the boosted pulse signal 41 is inactivated, is adjusted by the timing generating circuit 39 which is operated only after the internally generated row address signal 10 has been determined.

Further, in order to prevent the gate electrode 32 in the word line driver circuit 2 from being electrically disconnected before the potential of the gate electrode 82 is raised to the power voltage Vcc, and in order to prevent the word line boosting signal 11 from passing through the transfer transistor 31 to cause the bootstrap effect not to be exhibited before the gate electrode 32 is electrically disconnected, fine adjustment is made on the boosted pulse signal 41 by the delay device 501 in the boosted pulse generating circuit 50 such that the boosted pulse signal 41 is inactivated before the activation of the word line boosting signal 11 starts after the word line selecting signal 29 has been determined.

Figure 2:
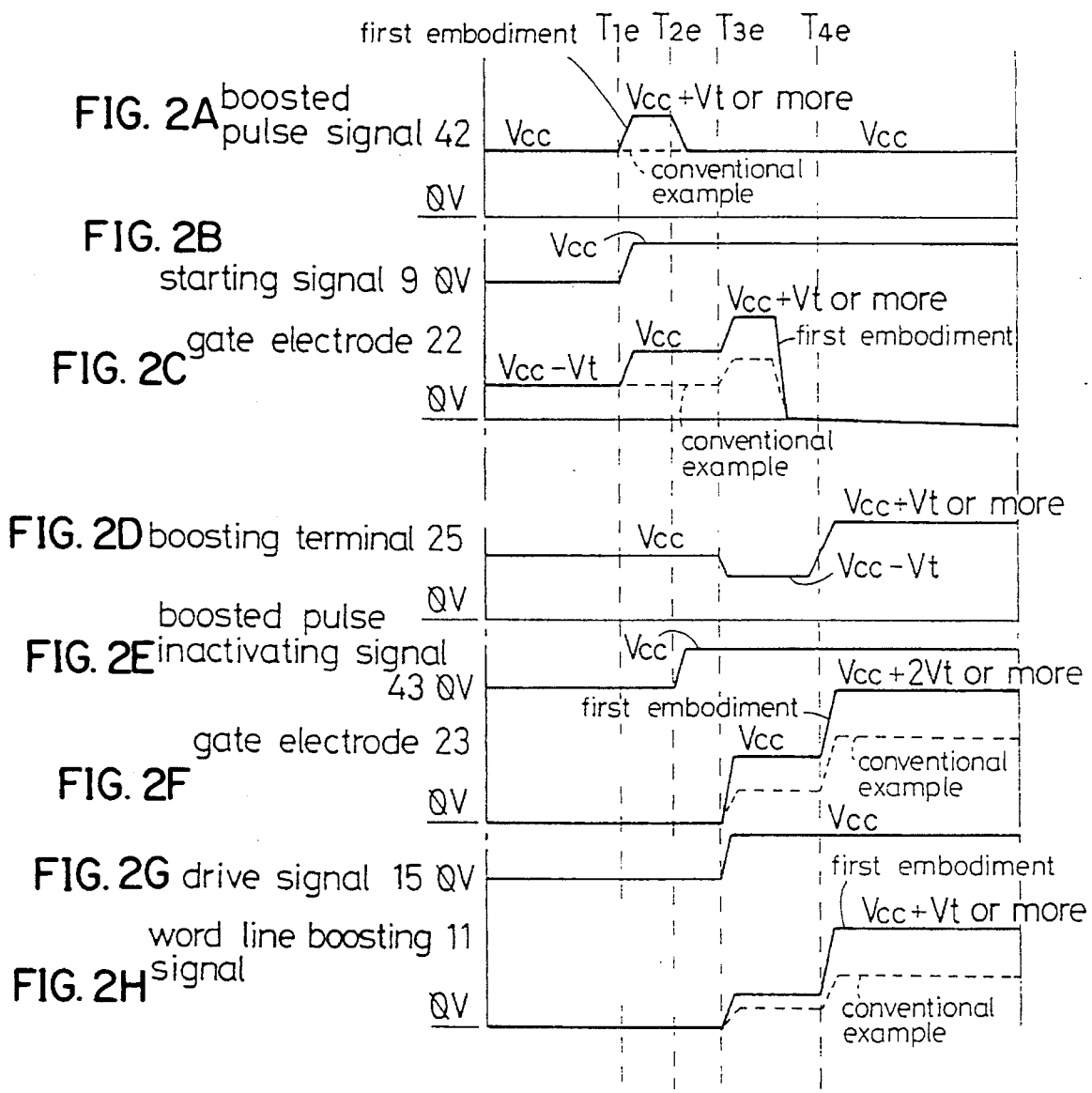
FIG. 2 is a view illustrating the comparison of the operation of the boosted potential generating circuit between the semiconductor device in FIG. 1 and a semiconductor device of prior art.

In the semiconductor device having the arrangement above-mentioned, the following description will discuss, with reference to FIG. 2, the operation of the boosted potential generating circuit 1 when the power voltage is low.

At the waiting state, each of the drive signal 13, the drive signal 15 and the gate electrode 23 is in the "L" level (0 V), each of the drive signal 14, the drive signal 16 and the boosting terminal 25 is in the "H" level (power voltage Vcc), and the drive signal 12 is in the "H" level (Vcc+Vt or more). Since the initial potential of the boosted pulse signal 42 is the power voltage Vcc, the potential of the gate electrode 22 is Vcc−Vt as in the semiconductor device of prior art.

When the starting signal (first signal) 9 is activated at T1e, the drive signal 16 is brought to the "L" level and the transistor 21 which has fixed the potential of the word line boosting signal (third signal) 11 to the grounding potential, becomes electrically non-conducted.

Subsequently, when the drive signal 12 is brought to the "L" level (=power voltage Vcc), the Vgd of the transistor 17 which initially charges the capacitor 24 and which has fixed the potential of the boosting terminal 25 to the power voltage, becomes 0 V such that the boosting terminal 25 is electrically disconnected from the power source 26. When the potential of the boosted pulse signal 42 is boosted to the voltage Vcc+Vt or more in synchronism with the starting signal 9, this cancels the drop of a voltage corresponding to Vt in the transfer transistor 18. Accordingly, the potential of the gate electrode 22 is raised to the power voltage Vcc (Vcc−Vt in the semiconductor device of prior art).

When the boosted pulse inactivating signal 43 is activated in synchronism with the internally generated row address signal 10 at time T2e, the boosted pulse signal 42 is brought to the "L" level (power voltage Vcc) and the Vgd in the transfer transistor 18 becomes 0 V. Accordingly, the gate electrode 22 is electrically disconnected from the drive signal 14. The subsequent operations will be carried out in the same manner as in prior art at the time when the power voltage is high. Thus, the word line boosting signal 11 can be raised to a high potential not less than the power voltage.

Figure 3:
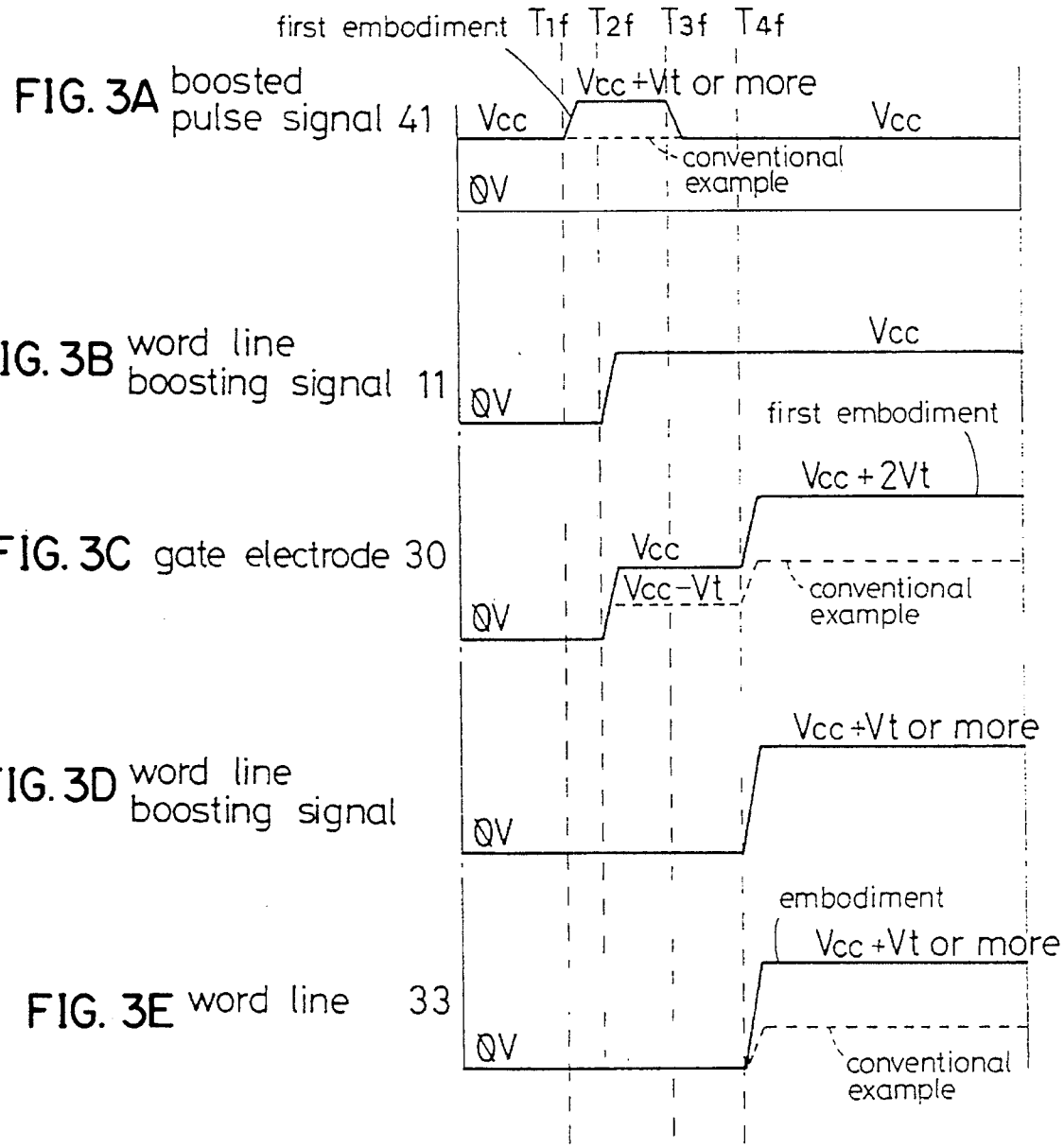
FIG. 3 is a view illustrating the comparison of the operation of the word line driver circuit between the semiconductor device in FIG. 1 and a semiconductor device of prior art.

With reference to FIG. 3, the following description will discuss the operation of the word line driver circuit 2 when the power voltage is Low.

At the waiting state, each of the potentials of the word line selecting signal 29, the gate electrode 32 and the word line 33 is in the "L" level (0 V).

When the potential of the boosted pulse signal 41 is raised from the power voltage Vcc to Vcc+Vt or more in synchronism with the starting signal (first signal) 9 at time T1f, this cancels the drop of a voltage corresponding to Vt in the transfer transistor 30. Accordingly, when the word line selecting signal 29 is raised to the "H" level at time T2f, the gate electrode 32 is electrically charged up to the power voltage Vcc (Vcc−Vt in the prior art).

When the boosted pulse inactivating signal 43 is activated in synchronism with the internally generated row address signal 10, the boosted pulse signal 41 is brought to the "L" level (power voltage Vcc) and the Vgd in the transfer transistor 30 becomes 0 V. Accordingly, the gate electrode 82 is electrically disconnected from the word line selecting signal 29. The subsequent operations will be carried out in the same manner as in the prior art at the time when the power voltage is high. Thus, the word line 33 can be raised to a high potential not less than the power voltage.

Figure 8:
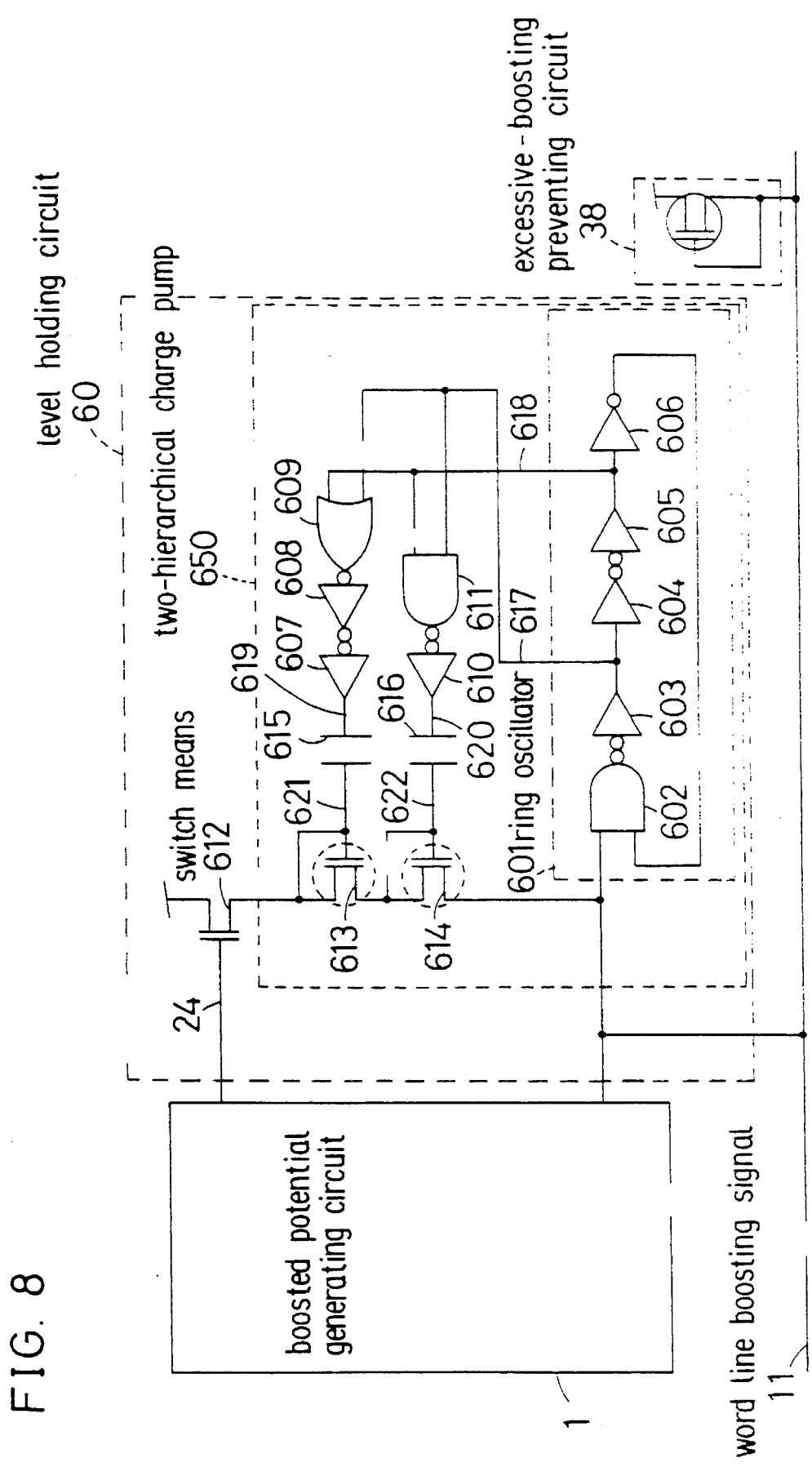
FIG. 8 is a schematic view of the level holding circuit and the excessive-boosting preventing circuit in the semiconductor device in FIG. 1.

FIG. 8 is a schematic view of the level holding circuit 60 and the excessive-boosting preventing circuit 38 according to the first embodiment. Shown in FIG. 8 are the boosted potential generating circuit 1, the word line boosting signal 11, the drive signal 24, the excessive-boosting preventing circuit 38 and the level holding circuit 60.

In the level holding circuit 60, an n-channel MOS transistor (switch means) 612 is disposed between the power source and the wiring of the word line boosting signal 11 and is to be electrically conducted by the drive signal 24 when the word line boosting signal 11 is supplied. A two-hierarchical charge pump 650 has a ring oscillator 601, NAND circuits 602, 611, inverters 603, 604, 605, 606, 607, 608, 610, and a NOR circuit 609. With the activation of the word line boosting signal 11, the operation of the ring oscillator 601 starts. Also shown in FIG. 8 are a first capacitor 615, a first MOS transistor 613 of which gate and drain are connected to the other end of the first capacitor 615, a second capacitor 616, a second MOS transistor 614 of which gate and drain are connected to the other end of the second capacitor 616 and which is connected in series to the first MOS transistor 613, and gate electrodes 621, 622 of the MOS transistor 613, 614.

In the charge pump 650, there are supplied drive signals 617, 618, 619, 620. The drive signals 617, 618 are oscillation signals to be taken out from the ring oscillator 601 and are shifted in phase from each other through inverters of even-number stages. The drive signal 619 is an inverse-phase signal of logical sum of the drive signals 617, 618, and the drive signal 620 is a signal of logical multiplication of the drive signals 617, 618. The drive signal 620 does not exist while the both drive signals 617, 618 are in the "H" level.

For each of the first and second MOS transistors 613, 614 shown as surrounded by broken lines in FIG. 8, there may be used a transistor of which threshold voltage is lower than that of other transistor 612.

Figure 9:
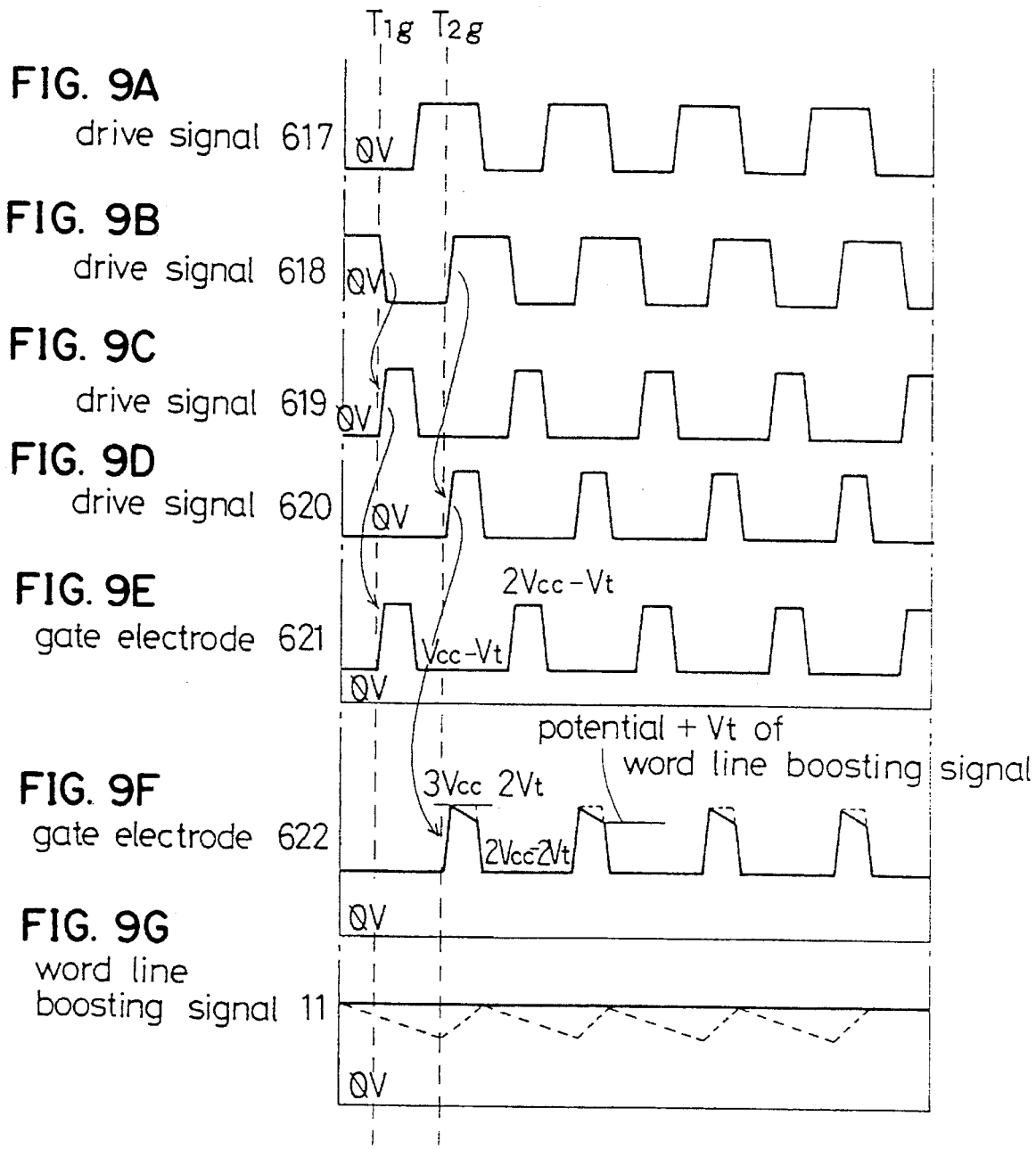
FIG. 9 is a view illustrating the operation of the level holding circuit 7 in FIG. 8.

With reference to FIG. 9, the following description will discuss the operation of the level holding circuit 60 having the arrangement above-mentioned.

When the boosted potential generating circuit 1 becomes operative, the word line boosting signal 11 is activated and the ring oscillator 601 is started. Further, since the drive signal 24 is brought to the "H" level, the transistor 612 becomes electrically conducted and the potential of the gate electrode 621 is raised to Vcc–Vt. At this time, since the drive signal 619 is in the "L" level (0 V), the capacitor 615 becomes in the electrically charged state (difference in potential across terminals=Vcc–Vt).

When the drive signal 619 is brought to the "H" level (power voltage Vcc) at time T1g, the electric charge accumulated in the capacitor 615 is pushed out. Simultaneously with an increase in gate electrode to 2 Vcc–Vt, the electric charge is transferred to the gate electrode 622 through the MOS transistor 613. This increases the potential of the gate electrode 622 to 2 Vcc–2 Vt. At this time, since the drive signal 620 is in the "L" level (0 V), the capacitor 616 becomes in the electrically charged state (difference in potential across terminals =2 Vcc–2 Vt).

When the drive signal 620 is brought to the "H" level (power voltage Vcc) at time T2g, the potential of the gate electrode 622 is raised to 3 Vcc–2 Vt by the capacitor 616. Accordingly, even though provision is made to provide a low power voltage source without Vt lowered, an electric current can be supplied without the transistor 614 brought to the electrically non-conducted state. For example, it is supposed that Vt is equal to 0.7 V when the power voltage Vcc is 1.5 V. In this case, the potential of the gate electrode 622 becomes 3 Vcc –2 Vt=3.1 V and the Vgs of the transistor 614 becomes not less than Vt.

In the first embodiment, when the word line boosting signal 11 is improved in level at the time the power voltage is low, it is required to prevent the potential of a word line from being raised too much at the time the power voltage is high. In this connection, there is disposed the excessive-boosting preventing circuit 38 in which the potential of the word line boosting signal 11 is clamped at Vcc+Vt.

The excessive-boosting preventing circuit 38 is formed by a transistor of which gate length is equal to or longer than that of the selection transistor 86 in the memory cell 35 in FIG. 1 and of which threshold voltage is not less than the threshold voltage Vt of the selection transistor 36. According to the arrangement, even though the threshold voltage Vt of the selection transistor 36 varies with process conditions, the clamping level corresponding to such variations can be set.

In the first embodiment, there is used, as the power source, an internal power voltage generated by dropping the external power voltage. However, similar effects may also be obtained when there is used a power source directly connected to the external power voltage or generated by boosting the external power voltage.

(Second Embodiment)

Figure 10:
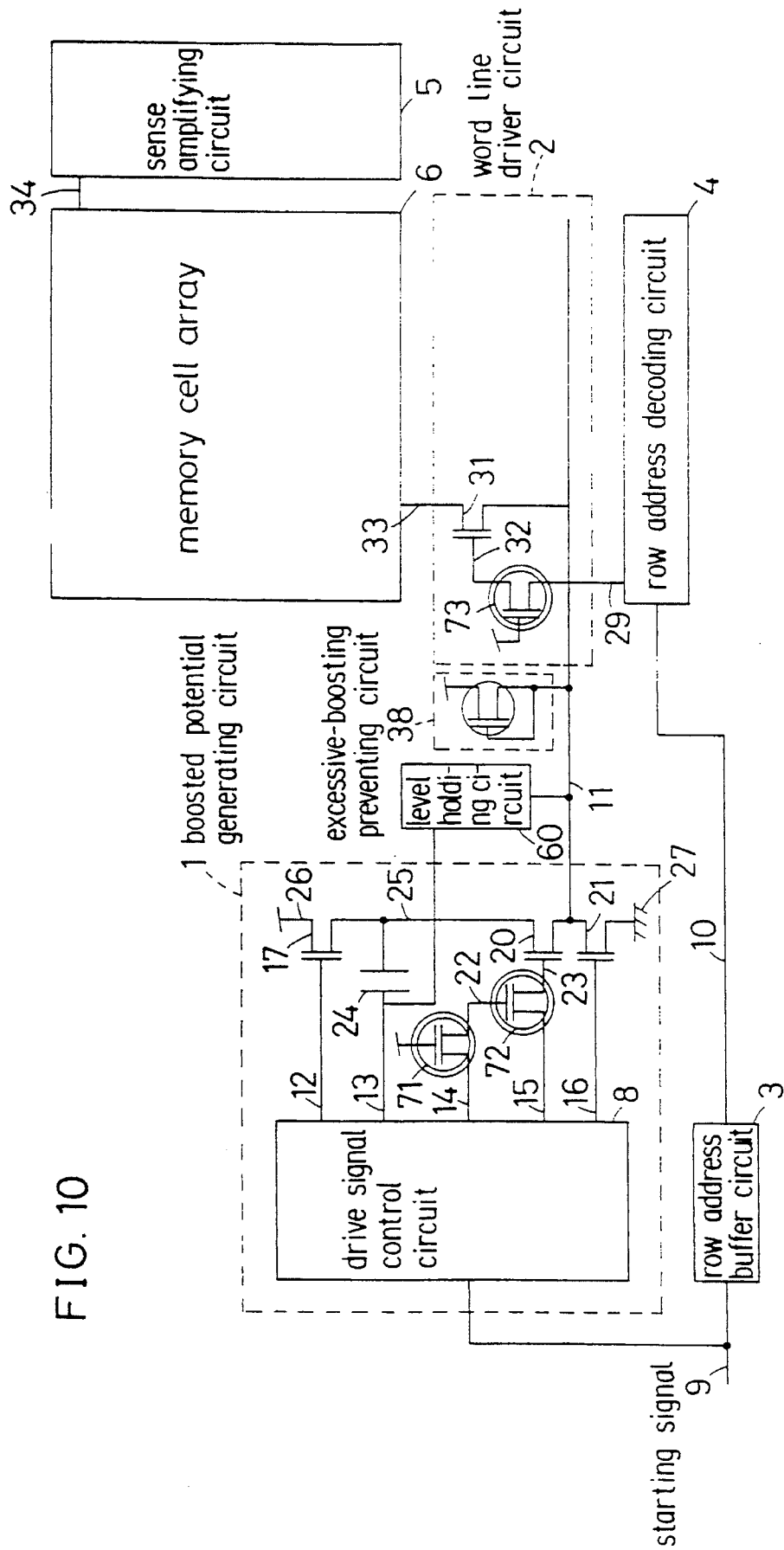
FIG. 10 is a schematic view of a semiconductor device according to a second embodiment of the present invention.

The following description will discuss a second embodiment of the present invention with reference to FIG. 10.

FIG. 10 is a schematic view of a semiconductor device according to the second embodiment of the present invention. Shown in FIG. 10 are a boosted potential generating circuit 1, a word line driver circuit 2, a row address buffer circuit 3, a row address decoding circuit 4, a sense amplifying circuit 5, a memory cell array 6, a drive signal control circuit 8, a starting signal 9, an internally generated row address signal 10, a word line boosting signal 11, drive signals 12, 13, 14, 15, 16, n-channel MOS transfer transistors 20, 21, 31, gate electrodes 22, 23, 32, a capacitor 24, a boosting terminal 25, a power source 26, a grounding 27, a word line selecting signal 29, a word line 33, and a bit line 34. It is noted that the semiconductor device has a plurality of word lines and a plurality of bit lines, but only one word line and only one bit line are shown in FIG. 10. The arrangement above-mentioned is the same as that in the prior art. Also disposed in the second embodiment are an excessive-boosting preventing circuit 38 and a level holding circuit 60. The arrangement above-mentioned is the same as in the first embodiment.

In FIG. 10, each of n-channel MOS transistors 71, 72, 73 has a threshold voltage lower than that of a usual transistor (hereinafter referred to as Vt(LOW). For example, the Vt(LOW) is about 0.2 V while the threshold voltage Vt of the usual transistor is about 0.5 V. In FIG. 10, each of these transistors 71, 72, 73 is shown in a double circle. In these n-channel MOS transistors 71, 72, 73, the concentration of impurities is different from that of other transistors such that the absolute value of the threshold voltage is lower than that of other transistors.

The following description will discuss the operation of the semiconductor device having the arrangement above-mentioned.

At the waiting state, each of the drive signal 13, the drive signal 15 and the gate electrode 23 is in the "L" level (0 V), and each of the drive signal 14, the drive signal 16 and the boosting terminal 25 is in the "H" level (power voltage Vcc). The drive signal 12 is in the "H" level (Vcc+Vt or more). The voltage of the gate electrode of the transfer transistor 71 is fixed to the power voltage Vcc. Accordingly, when the gate electrode 22 is electrically charged through the transfer transistor 71, there is generated a drop of voltage corresponding to Vt(LOW). Thus, the potential of the gate electrode 22 becomes Vcc−Vt(LOW). However, since Vt(LOW) is lower than Vt in the prior art, the potential of the gate electrode 22 in the second embodiment is higher than the potential of the gate electrode 22 in the circuit of the prior art. Then, the drive signal 15 is activated to electrically charge the gate electrode 23. However, the transfer transistor 72 is also a transistor of which threshold voltage is lower than Vt. Accordingly, even though the power voltage Vcc is low, the potential of the gate electrode 23 can be raised to the vicinity of the power voltage Vcc level. The subsequent operations will be carried out in a manner similar to that in the prior art. Thus, the word line boosting signal 11 can be boosted to the power voltage or more even though the power voltage Vcc is low.

The foregoing can also be applied to the word line driver circuit 2. More specifically, when the word line selecting signal 29 is activated, the gate electrode 32 is electrically charged up to Vcc−Vt(LOW) through the transfer transistor 73 and the gate electrode 32 is electrically disconnected. Since the voltage drop by Vt(LOW) is smaller than Vt, a high potential not less than the power voltage can be transmitted to the word line 33 even though the power voltage Vcc is lower than the voltage in the prior art.

It is a matter of course that the boosted pulse signals used in the first embodiment may be connected to the gate electrodes of the transfer transistors 71, 73. Further, a transistor having a low threshold voltage Vt may be used for each of the transistor for initially charging the capacitor in the boosted pulse generating circuit used in the first embodiment and the transfer transistor in the level holding circuit 60 therein.

(Third Embodiment)

Figure 11:
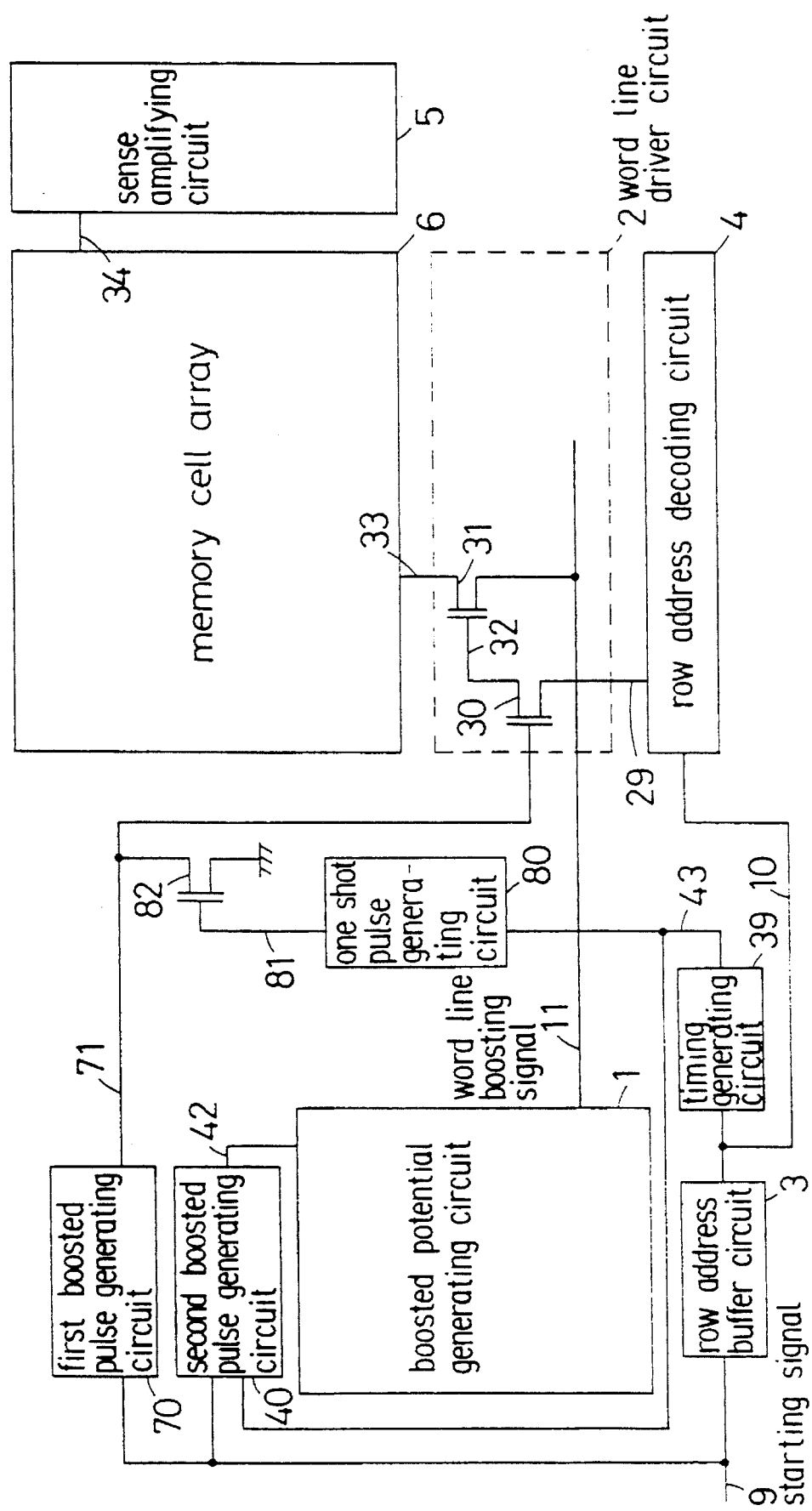
FIG. 11 is a schematic view of a semiconductor device according to a third embodiment of the present invention.
Figure 12:
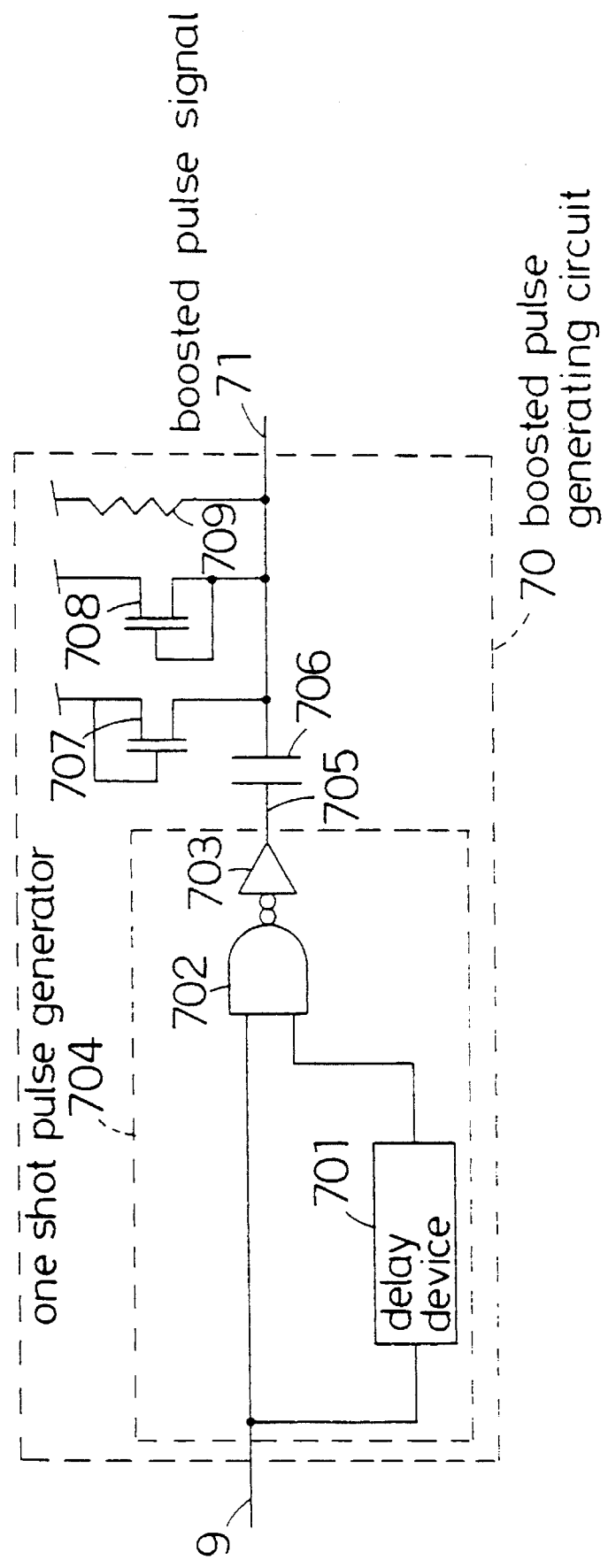
FIG. 12 is a schematic view of the boosted pulse generating circuit in the semiconductor device in FIG. 11.
Figure 13:
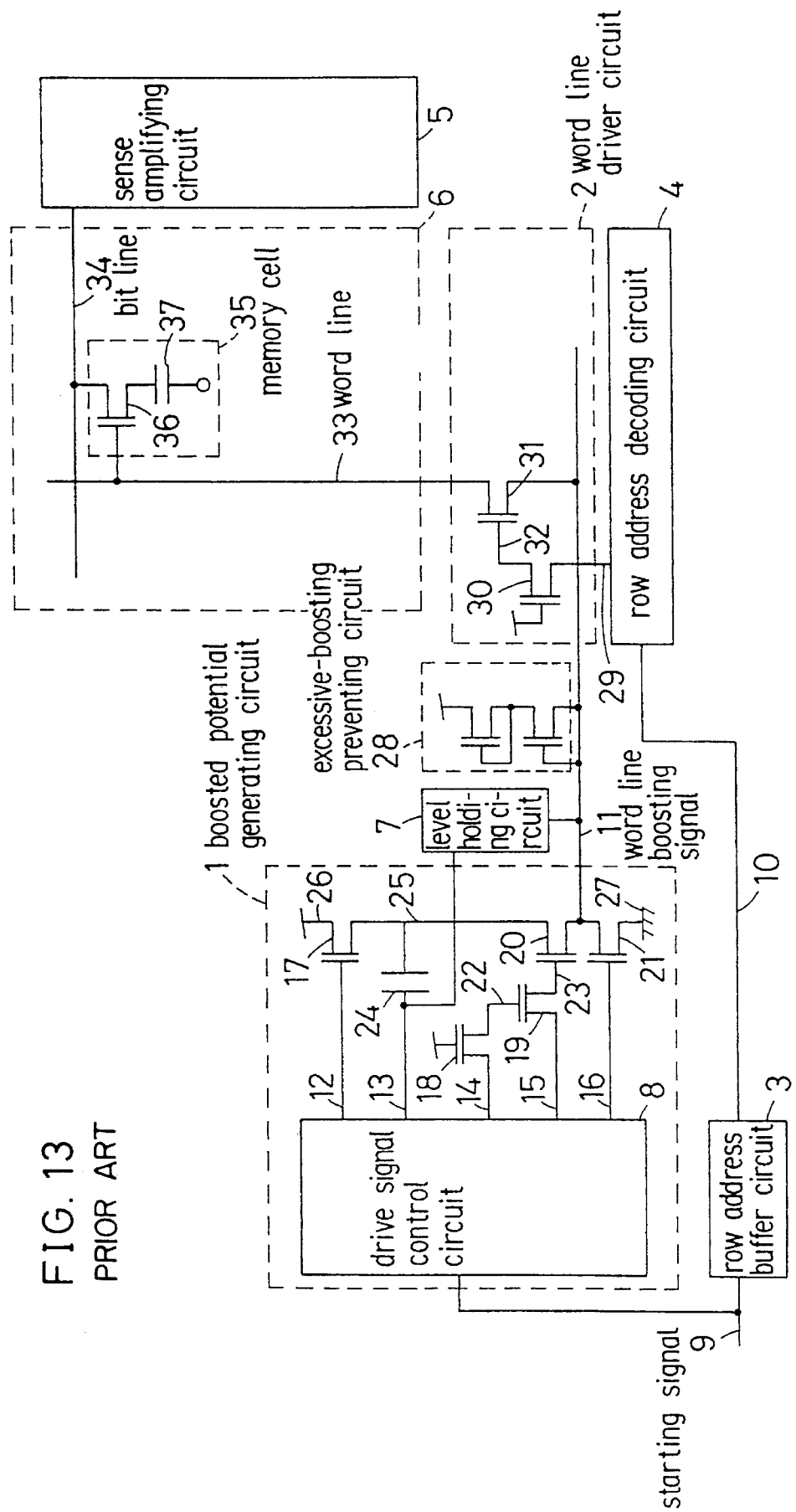
FIG. 13 is a schematic view of a semiconductor device of prior art.
Figure 14B:
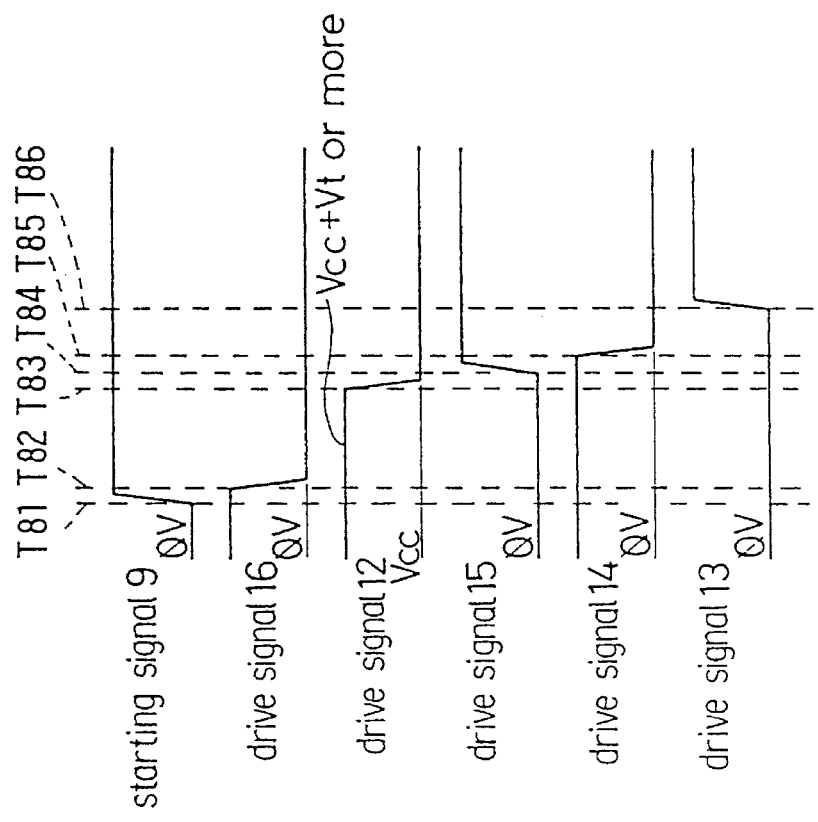
FIG. 14 is a schematic view of the drive signal control circuit in the semiconductor device of prior art in FIG. 13 and a view illustrating the operation thereof.
Figure 14A:
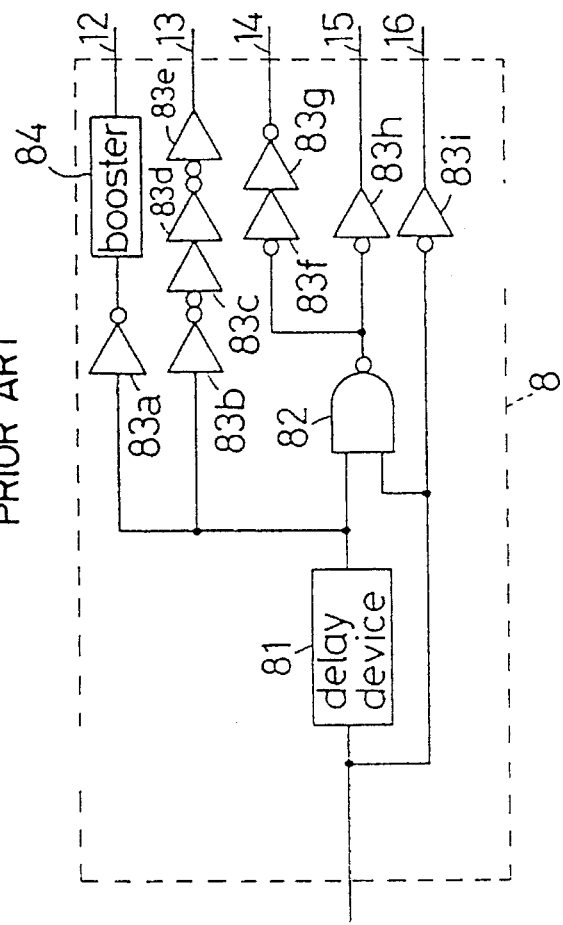
Figure 17:
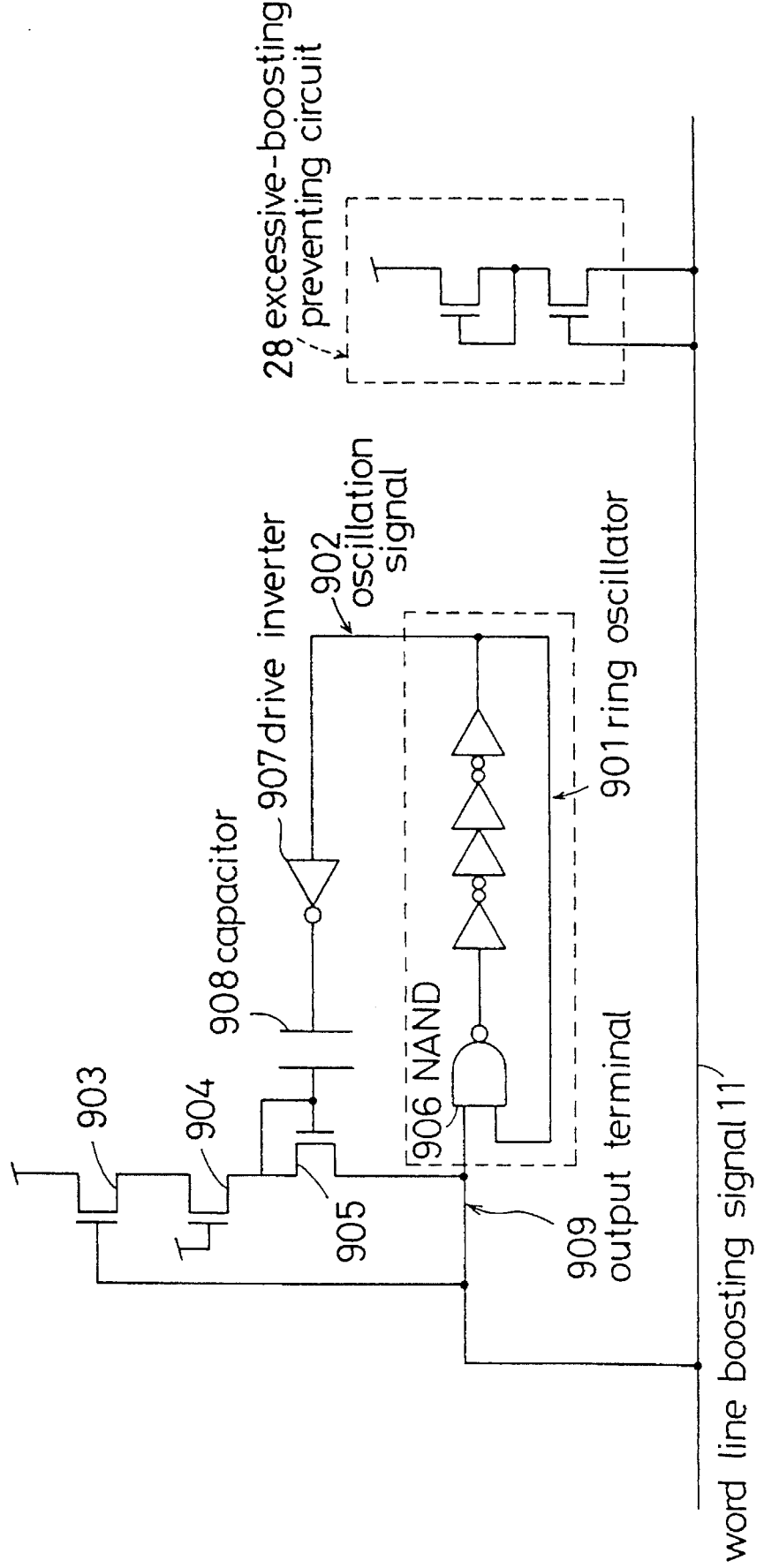
FIG. 17 is a view illustrating a specific arrangement of the level holding circuit and the excessive-boosting preventing circuit in the semiconductor device of prior art in FIG. 13.

The following description will discuss a third embodiment of the present invention with reference to FIGS. 11, 12.

FIG. 11 is a schematic view of a semiconductor device according to the third embodiment of the present invention. Shown in FIG. 11 are a boosted potential generating circuit 1, a word line driver circuit 2, a row address buffer circuit 3, a row address decoding circuit 4, a sense amplifying circuit 5, a memory cell array 6, a word line boosting signal 11, n-channel MOS transfer transistors 30, 31, a gate electrode 32 of the transfer transistor 31, a word line selecting signal 29, a word line 33, and a bit line 34. It is noted that the semi-conductor device has a plurality of word lines and a plurality of bit lines, but only one word line and only one bit line are shown in FIG. 11. The arrangement abovementioned is the same as that in the prior art. Also disposed in the third embodiment are a timing generating circuit 39, boosted pulse generating circuits 40, 70, boosted pulse signals 42, 71 and a boosted pulse inactivating signal 43.

Also shown in FIG. 11 are a one shot pulse generating circuit 80, a one shot pulse signal 81 and an n-channel MOS transistor 82.

FIG. 12 is a schematic view of the boosted pulse generating circuit 70 in the third embodiment. Shown in FIG. 12 are a starting signal 9, the boosted pulse signal 71, a delay device 701 formed by a series of inverters of odd-number stages, a NAND circuit 702, an inverter 703, a one shot pulse generator 704, a one shot pulse signal 705, a capacitor 706, n-channel MOS transistors 707, 708 and a resistor element 709 formed by an n-type well.

The Following description will discuss the operation of the semiconductor device having the arrangement abovementioned.

The operations of the boosted potential generating circuit 1, the word line driver circuit 2, the row address decoding circuit 4 and the boosted pulse generating circuit 40 are similar to those in the first embodiment. When the starting signal 9 is activated in the boosted pulse generating circuit 40, the one shot pulse generator 704 is started to generate the one shot pulse signal 705, and the potential of the boosted pulse signal 71 is changed from the "L" level (power voltage Vcc) to the "H" level (not less than power voltage). Since the word line selecting signal 29 is brought to the "H" level by the row address signal 10 simultaneously internally generated, the gate electrode 82 is electrically charged up to the power voltage Vcc level through the transfer transistor 30 in the word line driver circuit 2.

Thereafter, it is required that, by the time immediately before the word line boosting signal 11 becomes the "H" level (not less than Vcc+Vt), the boosted pulse signal 71 is brought to the "L" level (not greater than Vcc+Vt) and the gate electrode 32 is electrically disconnected. It is a matter of course that the one shot pulse signal 705 in the boosted pulse generating circuit 70 is brought to the "L" level (0 V) such that the combined effect of the capacitor 706 causes the boosted pulse signal 71 to be brought to the "L" level (not greater than Vcc+Vt). However, the delay time after which the boosted pulse signal 71 is changed to the "L" level, is increased dependent on the drive ability of the inverter 703 and the capacitance value of the capacitor 706. In this connection, the one shot pulse signal 81 is generated by the boosted pulse inactivating signal 43 and the transistor 82 is momentarily electrically conducted, such that the boosted pulse signal 71 is quickly brought to the "L" level (not greater than Vcc+Vt).

We claim:

1. A semiconductor device comprising a signal transmitting device in which, upon generation of a first signal, a second signal is transmitted and then supplied as a third signal, the signal transmitting device comprising: a first transistor arranged such that, upon generation of the first signal, the second signal is transmitted and then supplied as the third signal; and a second transistor for electrically charging and discharging the gate electrode of the first transistor, the semiconductor device having a boosted pulse generator for generating a boosted pulse which is brought to the high level not less than the power voltage at the timing at which the first signal is activated or inactivated, and which is brought to the low level before the second signal is activated, a boosted pulse from the boosted pulse generator being entered into the gate electrode of the second transistor of the signal transmitting device.

2. A semiconductor device according to claim 1, wherein the signal transmitting device is a word line driver circuit for transmitting a word line boosting signal, as the second signal, for boosting a word line of a memory and for supplying the word line boosting signal to the word line.

3. A semiconductor device according to claim 1, wherein the signal transmitting device is a word line boosting signal generator for generating a high-potential word line boosting signal, as the third signal, for a word line of a memory.

4. A semiconductor device according to claim 3, wherein the word line boosting signal generator has a third transistor of which gate electrode is electrically charged and discharged by the first transistor for transmitting a signal having a high voltage which is not less than the power voltage.

5. A semiconductor device according to any of claims 2 to 4, wherein the first signal is a starting signal for generating a row address of the memory.

6. A semiconductor device according to any of claims 1 and 3, further comprising;

an address buffer arranged to latch a row address based on the first signal for generating an internal address signal;

memory arrays disposed in matrix in the row and column directions;

a word line group arranged in the row direction on the memory arrays;

a decoding circuit for selecting at least one word line out of the word line group based on the internal address signal;

a word line driver circuit for transmitting a high-potential word line boosting signal to the at least one word line selected by the decoding circuit;

a first boosted pulse generator for generating a first boosted pulse of which high level is a potential not less than the power voltage, the first boosted pulse being supplied to the gate electrode of the second transistor in the word line driver circuit;

a word line boosting signal generator for generating a word line boosting signal to be transmitted from the word line driver circuit to the at least one word line; and a second boosted pulse generator for generating a second boosted pulse of which high level is a potential not less than the power voltage, the second boosted pulse being supplied to the gate electrode of the second transistor of the word line boosting signal generator.

7. A semiconductor device according to any of claims 1 to 4, wherein both of or one of the first and second transistors of the signal transmitting device is formed by a transistor of which threshold voltage is lower than that of each of other transistors forming the signal transmitting device.

8. A semiconductor device according to any of claims 1 to 4, wherein the pulse width of a boosted pulse which is generated by the boosted pulse generator, the first boosted pulse generator or the second boosted pulse generator and which electrically charges and discharges the gate electrode of the second transistor is so set that the gate electrode of the first transistor is electrically disconnected from the second transistor until the second signal is transmitted by the first transistor after the first transistor is electrically conducted by electrically charging the gate electrode of the first transistor is to the level of the power voltage.

9. A semiconductor device according to any of claims 1 to 3, wherein a boosted pulse of the boosted pulse generator or the first boosted pulse generator is controlled to hold the potential of the gate electrode of the second transistor at a high level until the gate electrode of the first transistor is electrically charged to the level of the power voltage, and to bring the potential of the gate electrode of the second transistor down to the level of the power voltage or to a level lower than the voltage which is higher than the power voltage by the threshold voltage of the second transistor before the second signal is transmitted to the first transistor.

10. A semiconductor device according to claim 6, wherein a boosted pulse of the second boosted pulse generator is controlled to hold the potential of the gate electrode of the second transistor of the word line boosting signal generator at a potential not less than the power voltage until the gate electrode of the first transistor is electrically charged to the level of the power voltage, and to bring the potential of the gate electrode of the second transistor down to the level of the power voltage or to a level lower than the voltage which is higher than the power voltage by the threshold voltage of the second transistor before the potential of the gate electrode of the third transistor is electrically charged to the level of the power voltage by the first transistor.

11. A semiconductor device according to any of claims 1 to 4, 9 and 10, wherein a boosted pulse of the boosted pulse generator has a high level which is higher than the power voltage by the threshold voltage of the transistor, and has a low level which is equal to the power voltage or a voltage between the power voltage and the grounding voltage.

12. A semiconductor device according to claim 1, wherein the boosted pulse generator has (i) a capacitor having a first terminal connected to the output terminal of the boosted pulse generator, and (ii) electrically charging means interposed between the output terminal and the power source, the capacitor having a second terminal which is brought to a high level at the timing at which the first signal is activated or inactivated, such that a boosted pulse is generated.

13. A semiconductor device according to claim 12, wherein the electrically charging means has a resistor formed by a well forming diffusion layer in which degree of impurities is lower than that of a drain-source diffusion layer and of which resistance value is higher than that of the drain-source diffusion layer.

14. A semiconductor device according to claim 12, wherein the electrically charging means is formed by an n-channel MOS transistor which is interposed between the output terminal and the power source and which has the gate electrode into which the third signal having a high level not less than the power voltage is entered at the operation of the semiconductor device, whereby the output terminal is electrically charged to the level of the power voltage.

15. A semiconductor device according to claim 12, wherein the electrically charging means is formed by an n-channel MOS transistor which is interposed between the output terminal and the power source and of which gate electrode is connected to the power source, whereby the output terminal is always electrically charged to a level lower than the power voltage by the threshold voltage of the n-channel MOS transistor.

16. A semiconductor device according to claim 15, wherein the n-channel MOS transistor is formed by a transistor of which threshold voltage is lower than that of each of other transistors forming the boosted pulse generator.

17. A semiconductor device according to claim 12, wherein the electrically charging means has: a second capacitor of which capacitance is smaller than the capacitor connected to the output terminal; an n-channel MOS transistor interposed between a first terminal of the capacitor connected to the output terminal and the power source; and second electrically charging means interposed between a first terminal of the second capacitor and the power source, the first terminal of the second capacitor being connected to the gate electrode of the n-channel MOS transistor, and the electrically charging means is arranged such that, at the waiting state, a second terminal of the second capacitor is brought to a high level to boost the first terminal of the second capacitor to a high potential not less than the power voltage, whereby the first terminal of the capacitor connected to the output terminal is electrically charged to the level of the power voltage through the n-channel MOS transistor.

18. A semiconductor device according to claim 12, wherein a fourth transistor is interposed between the output terminal of the boosted pulse generator and the grounding line, the fourth transistor being controlled such that the fourth transistor is momentarily electrically conducted before the second signal is activated and after the gate electrode of the first transistor of the signal transmitting device is electrically charged to the level of the power voltage, whereby the output terminal of the boosted pulse generator is grounded and brought to a low level.

19. A semiconductor device according to claim 12, wherein there is interposed, between the output terminal of the boosted pulse generator and the power source, an n-channel MOS transistor of which gate electrode is connected to the output terminal, the potential of the output terminal being clamped at a potential higher than the power voltage by the threshold voltage of the transistor.

20. A semiconductor device according to claim 12, wherein the boosted pulse generator has a one shot pulse generator for generating a one shot pulse at the timing at which the first signal is activated or inactivated, the one shot pulse generator being connected to the second terminal of the capacitor for temporarily bringing the second terminal of the capacitor to a high level.

21. A semiconductor device comprising a signal transmitting device in which, upon generation of a first signal, a second signal is transmitted and then supplied as a third signal, the signal transmitting device comprising: a first transistor arranged such that, upon generation of the first signal, the second signal is transmitted and then supplied as the third signal; and a second transistor for electrically charging and discharging the gate electrode of the first transistor, both of or one of the first and second transistors being formed by a transistor of which threshold voltage is lower than that of each of other transistors forming the signal transmitting device, said semiconductor device further comprising a level holding means for holding the potential level of the third signal of the signal transmitting device, the level holding means comprising, between the power source and the wiring for the third signal, at least first and second charge pumps and switch means to be electrically conducted when the third signal is supplied.

22. A semiconductor device according to any of claims 1 and 3 further comprising:

level holding means for holding the potential level of the third signal of the signal transmitting device, the level holding means comprising, between the power source and the wiring for the third signal, at least first and second charge pumps and switch means to be electrically conducted when the third signal is supplied.

23. A semiconductor device according to claim 2, wherein the two-hierarchial charge pump comprises:

an oscillation circuit for supplying a plurality of first pulse waves and a plurality of second pulse waves which are complementary to each other such that their high level periods do not overlap each other;

a first capacitor having one end to which a first pulse wave of the oscillation circuit is entered;

a first MOS transistor of which gate and drain are connected to the other end of the first capacitor;

a second capacitor having one end to which a second pulse wave of the oscillation circuit is entered; and a second MOS transistor of which gate and drain are connected to the other end of the second capacitor and which is connected in series to the first MOS transistor.

24. A semiconductor device according to claim 23, wherein each of the first and second MOS transistors has a threshold voltage lower than that of each of other transistors forming the level holding means.

25. A semiconductor device according to any of claims 3 and 21, further comprising excessive-boosting preventing means for preventing a word line boosting signal generated by the word line boosting signal generator from being excessively boosted, the excessive-boosting preventing means having an excessive-boosting preventing transistor interposed between the power source and the passage for the word line boosting signal, the word line boosting signal being entered into the gate electrode of the excessive-boosting preventing transistor, the threshold voltage of the excessive-boosting preventing transistor being not less than that of each of selection transistors connected to the memory cells.

26. A semiconductor device according to claim 25, wherein each of the excessive-boosting preventing transistor and the selection transistors is formed by a transistor of which threshold voltage is higher than that of each of other transistors.

27. A semiconductor device according to claim 25, wherein the gate length of the excessive-boosting preventing transistor is longer than that of the selection transistor.

28. A semiconductor device according to any of claims 16, 21 and 24, wherein each transistor having a lower threshold voltage is different in the degree of impurities from other transistors such that the absolute value of the threshold voltage is smaller.

29. A semiconductor device according to any of claims 1 to 4, 10, 12 to 21, 23, 24, 26 and 27, wherein the power voltage is an internal power voltage as directly connected to an external power source, or as generated by dropping or boosting the external power voltage.

* * * * *

UNITED STATES PATENT AND TRADEMARK OFFICE
CERTIFICATE OF CORRECTION

PATENT NO. : 5,550,775
DATED      : August 27, 1996
INVENTOR(S) : Wataru Abe et al.

It is certified that error appears in the above-identified patent and that said Letters Patent is hereby corrected as shown below:

Column 20, Line 3:  "2," should read -- 21 --.

Signed and Sealed this

Twenty-ninth Day of December, 1998

Attest:

BRUCE LEHMAN

Attesting Officer

Commissioner of Patents and Trademarks